US006963077B2

(12) United States Patent
DeHon et al.

(10) Patent No.: US 6,963,077 B2
(45) Date of Patent: Nov. 8, 2005

(54) SUBLITHOGRAPHIC NANOSCALE MEMORY ARCHITECTURE

(75) Inventors: André DeHon, Pasadena, CA (US); Charles M. Lieber, Lexington, MA (US); Patrick D. Lincoln, Woodside, CA (US); John E. Savage, Providence, RI (US)

(73) Assignees: California Institute of Technology, Pasadena, CA (US); President and Fellows of Harvard College, Cambridge, MA (US); Brown University, Providence, RI (US); SRI International, Menlo Park, CA (US)

(*) Notice: Subject to any disclaimer, the term of this patent is extended or adjusted under 35 U.S.C. 154(b) by 0 days.

(21) Appl. No.: 10/627,406

(22) Filed: Jul. 24, 2003

(65) Prior Publication Data

US 2004/0113139 A1 Jun. 17, 2004

Related U.S. Application Data

(60) Provisional application No. 60/467,388, filed on May 2, 2003, provisional application No. 60/465,357, filed on Apr. 25, 2003, provisional application No. 60/441,995, filed on Jan. 23, 2003, provisional application No. 60/429,010, filed on Nov. 25, 2002, provisional application No. 60/415,176, filed on Sep. 30, 2002, provisional application No. 60/400,394, filed on Aug. 1, 2002, and provisional application No. 60/398,943, filed on Jul. 25, 2002.

(51) Int. Cl.[7] .............................................. H01L 29/06
(52) U.S. Cl. .............. 257/9; 257/E51.04; 257/E51.023; 977/DIG. 1
(58) Field of Search ............................... 257/9, E51.04, 257/E51.023; 977/DIG. 1

(56) References Cited

U.S. PATENT DOCUMENTS 6,128,214 A   10/2000 Kuekes et al. ............... 364/151

| | | | |
|---|---|---|---|
| 6,256,767 B1 | 7/2001 | Kuekes et al. | 716/9 |
| 6,314,019 B1 | 11/2001 | Kuekes et al. | 365/151 |
| 6,383,784 B1 | 5/2002 | Smith | 435/91.2 |
| 2002/0027819 A1 | 3/2002 | Tomanek et al. | 365/215 |
| 2002/0175390 A1 | 11/2002 | Goldstein et al. | 257/481 |
| 2003/0089899 A1 * | 5/2003 | Lieber et al. | 257/9 |
| 2003/0200521 A1 | 10/2003 | DeHon et al. | 716/16 |
| 2003/0206436 A1 * | 11/2003 | Eaton et al. | 365/177 |
| 2004/0113138 A1 | 6/2004 | DeHon et al. | 257/9 |

FOREIGN PATENT DOCUMENTS

| WO | 02/103753 A2 | 12/2002 |
|---|---|---|
| WO | 03/063208 A2 | 7/2003 |
| WO | 2004/034467 A2 | 4/2004 |
| WO | 2004/061859 A2 | 7/2004 |

OTHER PUBLICATIONS

U.S. Appl. No. 10/853,907, filed May 25, 2004, DeHon et al.
U.S. Appl. No. 10/856,115, filed May 28, 2004, DeHon et al.
U.S. Appl No. 10/925,863, filed Aug. 24, 2004 DeHon et al.
Albrecht, O., et al., "Construction and Use of LB Deposition Machines for Pilot Production," *Thin Solid Films*, vol. 284–285, pp. 152–156 (Sep. 15,1996).

(Continued)

*Primary Examiner*—David Nelms
*Assistant Examiner*—Tu-Tu Ho
(74) *Attorney, Agent, or Firm*—Ladas & Parry LLP

(57) ABSTRACT

A memory array comprising nanoscale wires is disclosed. The nanoscale wires are addressed by means of controllable regions axially and/or radially distributed along the nanoscale wires. In a one-dimensional embodiment, memory locations are defined by crossing points between nanoscale wires and microscale wires. In a two-dimensional embodiment, memory locations are defined by crossing points between perpendicular nanoscale wires. In a three-dimensional embodiment, memory locations are defined by crossing points between nanoscale wires located in different vertical layers.

49 Claims, 18 Drawing Sheets

OTHER PUBLICATIONS

Björk, M.T., et al., "One–Dimensional Steeplechace for Electrons Realized," *Nano Letters*, vol. 2, No. 2, pp. 87–89 (2002).

Brown, C.L., et al., "Introduction of (2) Catenanes Into Langmuir Films and Langmuir–Blodgett Multilayers. A Possible Strategy for Molecular Information Storage Materials," *Langmuir*, vol. 16, No. 4, pp. 1924–1930 (2000).

Chen, Y., et al., "Nanoscale Molecular–Switch Crossbar Circuits," *Institute of Physics Publishing*, Nanotechnology 14, pp. 462–468 (2003).

Chen, Y., et al., "Self–Assembled Growth of Epitaxial Erbium Disilicide Nanowires on Silicon (001)," *Applied Physics Letters*, vol. 76, No. 2, pp. 4004–4006 (Jun. 26, 2000).

Chou, S. Y., "Sub–10 nm Imprint Lithography and Applications," *J. Vac. Sci. Technol. B*, vol. 15, No. 6, pp. 2897–2904 (Nov./Dec. 1997).

Collier, C.P., et al., "A (2) Catenane–Based Solid State Electronically Reconfigurable Switch," *Science*, vol. 289, pp. 1172–1175 (Aug. 18,2000).

Collier, C.P., et al., "Electronically Configurable Molecular–Based Logic Gates," *Science*, vol. 285, pp. 391–394 (Jul. 16, 1999).

Cui, Y., et al., "Diameter–Controlled Synthesis of Single–Crystal Silicon Nanowires," *Applied Physics Letters*, vol. 78, No. 15, pp. 2214–2216 (Apr. 9, 2001).

Cui, Y., et al., "Doping and Electrical Transport in Silicon Nanowires," *The Journal of Physical Chemistry*, vol. 104, No. 22, pp. 5213–5216 (Jun. 8, 2000).

Cui, Y., et al., "Functional Nanoscale Electronic Devices Assembled Using Silicon Nanowire Building Blocks," *Science*, vol. 291, pp. 851–853 (Feb. 2, 2001).

Dekker, C., "Carbon Nanotubes As Molecular Quantum Wires," *Physics Today*, pp. 22–28 (May 1999).

Derycke, V., et al., "Carbon Nanotube Inter– and Intramolecular Logic Gates," *Nano Letters*, vol. 1, No. 9, pp. 453–456 (Sep. 2001).

Goldstein, S.C., et al., "NanoFabrics: Spatial Computing Using Molecular Electronics," *Proc. Of The 28th Annual International Symposium on Computer Architecture*, pp. 1–12 (Jun. 2001).

Gudiksen, M.S., et al., "Growth of Nanowire Superlattice Structures for Nanoscale Photonics and Electronics," *Nature*, vol. 415, pp. 617–620 (Feb. 7, 2002).

Huang, Y., et al., "Directed Assembly of One–Dimensional Nanostructures Into Functional Networks," *Science*, vol. 291, pp. 630–633 (Jan. 26, 2001).

Huang, Y., et al., "Logic Gates and Computation From Assembled Nanowire Building Blocks," *Science*, vol. 294, pp. 1313–1317 (Nov. 9, 2001).

Lauhon, L.J., et al., "Epitaxial Core–Shell and Core–Multishell Nanowire Heterostructures," *Nature*, vol. 420, pp. 57–61 (Nov. 7, 2002).

Lieber, C.M., "Nanowire Superlattices," *Nano Letters*, vol. 2; No. 2, pp. 81–82 (Feb. 2002).

Morales, A.M., et al., "A Laser Ablation Method for the Sythesis of Crystalline Semiconductor Nanowires," *Science*, vol. 279, pp. 208–211 (Jan. 9, 1998).

Tans, S.J., et al., "Room–Temperature Transitor Based On A Single Carbon Nanotube," *Nature*, vol. 393, pp. 49–52 (May 7, 1998).

Ulman, A., "Part Two: Langmuir–Blodgett Films," *An Introduction to Ultrathin Organic Films*, Section 2.1, pp. 101–132 (1991).

Whang, D., et al., "Nanolithography Using Hierarchically Assembled Nanowire Masks," *Nano Letters*, vol. 3, No. 7, pp. 951–954 (2003).

Wu, Y., et al., "Block–by–Block Growth of Single–Crystaline Si/SiGe Superlattice Nanowires," *Nano Letters*, vol. 2, No. 2, pp. 83–86 (2002).

DeHon, A., "Array–Based Architecture for Fet–Based, Nanoscale Electronics," *IEEE Transactions on Nanotechnology*, vol. 2, No. 1, pp. 23–32 (Mar. 2003).

U.S. Appl. No. 10/853,907, filed May 5, 2004, DeHon et al.

U.S. Appl. No. 10/856,115, filed May 28, 2004, DeHon et al.

U.S. Appl. No.10/925,863, Aug. 24, 2004, DeHon et al.

* cited by examiner

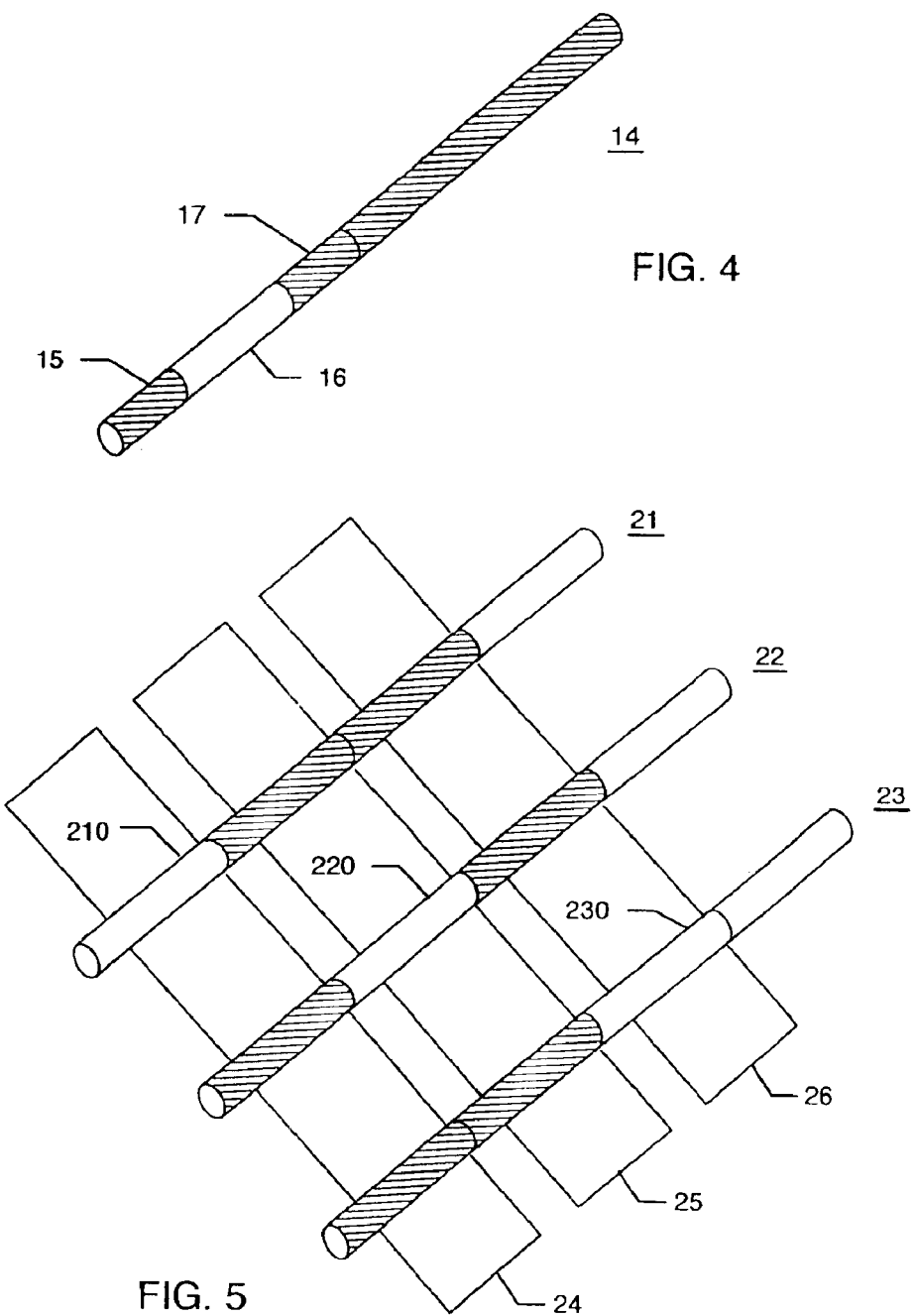

US 6,963,077 B2

SUBLITHOGRAPHIC NANOSCALE MEMORY ARCHITECTURE

CROSS REFERENCE TO RELATED APPLICATIONS

This application claims the benefit of U.S. provisional Patent Application Ser. No. 60/398,943 filed Jul. 25, 2002 for a "Modulation Doped Molecular-Scale Address Decoding" by Andre' DeHon, Patrick Lincoln, U.S. provisional Patent Application Ser. No. 60/400,394 filed Aug. 1, 2002 for a "Implementation of Computation Note 15: Integration Issues for Modulation Doped Memory" by Andre' DeHon, Patrick Lincoln, U.S. provisional Patent Application Ser. No. 60/415,176 filed Sep. 30, 2002 for "Nanoscale Architectures based on Modulation Doping" by Andre' DeHon, Patrick Lincoln, Charles Lieber, U.S. provisional Patent Application Ser. No. 60/429,010 filed Nov. 25, 2002 for "Stochastic Assembly of Sublithographic Nanoscale Interfaces" by Andre' DeHon, Patrick Lincoln, John E. Savage, U.S. provisional Patent Application Ser. No. 60/441,995 filed Jan. 23, 2003 for "Stochastic Assembly of Sublithographic Nanoscale Interfaces" by Andre' DeHon, Charles Lieber, Patrick Lincoln, U.S. provisional Patent Application Ser. No. 60/465,357, Ser. No. not yet assigned, filed Apr. 25, 2003 for "Sublithographic Nanoscale 3D Architectures" by Andre' DeHon, and U.S. provisional Patent Application Ser. No. 60/467,388, Ser. No. not yet assinged, filed May 2, 2003 for "Computing with Electronic Nanotechnologies" by John E. Savage, Andre' DeHon, Patrick Lincoln, Lee-Ad Gottlieb, Arkady Yerukhimovich, the disclosure of all of which is incorporated herein by reference. Also incorporated by reference is the disclosure of U.S. patent application Ser. No. 10/627,405 filed on the same day of the present application for a "Stochastic Assembly of Sublithographic Nanoscale Interfaces" by John E. Savage, Andre' DeHon, Patrick Lincoln, and Charles Lieber.

STATEMENT REGARDING FEDERALLY SPONSORED RESEARCH OR DEVELOPMENT

The present invention was made with support from the United States Government under Grant number N00014-01-0651 awarded by the Office of Naval Research of the Department of the Navy, and Grant CCR-0210225 awarded by the National Science Foundation. The United States Government has certain rights in the invention.

BACKGROUND OF THE INVENTION

1. Field of the Invention

The present invention relates to the field of Sublithographic fabrication of electronic circuits. More specifically, methods and apparatus for controlling electric conduction on nanoscale wires from both lithographic wires and nanoscale wires are disclosed, such as a stochastic assembly of sublithographic nanoscale interfaces and a sublithographic nanoscale memory architecture.

2. Description of the Prior Art

Technologies to build nanoscale crosspoints are already known. FIG. 1 is a schematic cross-sectional view which shows a suspended prior art nanotube conductor 1 coupled to a plurality of lower carbon nanotube or silicon nanoscale wire conductors 2, 3, and 4 separated by a plurality of supports 5. The supports are made of a dielectric material, such as silicon dioxide. In this way, a nanotube-nanotube (or nanotube-nanoscale wire) junction is formed. The junction is bistable with an energy barrier between the two states. In one state, see tubes 1-2 and 1-4, the tubes are "far" apart and mechanical forces keep the top wire 1 from descending to the lower wire 2, 4. At this distance the tunneling current between the crossed conductors is small, resulting, effectively, in a very high resistance (GigaOhms) between the conductors. In the second state, see tubes 1-3, the tubes come into contact or near contact and are held together via molecular forces. In this state, there is little resistance (about 100 K$\Omega$) between the tubes. By applying a voltage between tubes, one can charge them to the same or opposite polarities and use electrical charge attraction/repulsion to cross the energy gap of the junction between the two bi-stable states, effectively setting or resetting the programming of the connection. These junctions can be rectifying such that the connected state exhibits PN-diode rectification behavior. Molecular electronics PN-junctions are disclosed, for example, in Y. Cui and C. M. Lieber, "Functional Nanoscale Electronic Devices Assembled using Silicon Nanoscale wire Building Blocks," Science 291, 851–853 (2001).

Techniques for storing non-volatile memory bits at the crosspoints of a nanoscale wire array are already known in the art. See, for example, C. P. Collier, E. W. Wong, M. Belohradsky, F. M. Raymo, J. F. Stoddard, P. J. Kuekes, R. S. Williams, and J. R. Heath, "Electronically configurable molecular-based logic gates," Science, vol. 285, pp.391–394, 1999. Bits can typically be programmed by placing a large voltage across individual crosspoint junctions. The status of each crosspoint is read by observing the current flowing through a junction. Programmed "ON" junctions will act as low resistance paths, while programmed "OFF" junctions will act as high resistance paths.

Also known in the prior art is how doped silicon nanoscale wires can exhibit Field-Effect Transistor (FET) behavior. FIG. 2 is a schematic perspective view of a prior art embodiment which shows oxide 10 grown over a silicon nanoscale wire 11 to prevent direct electrical contact of a crossed conductor 12, for example a carbon nanotube or a silicon nanoscale wire. The electrical field of one wire can then be used to "gate" the other wire, locally evacuating a region of the doped silicon nanoscale wire of carriers to prevent conduction. FET resistance varies from Ohms to GigaOhms. Similarly, also carbon nanotubes can exhibit FET behavior. See, for example, Yu Huang, Xiangfeng Duan, Yi Cui, Lincoln Lauhon, Kevin Kim and Charles M. Lieber, "Logic Gates and Computation from Assembled Nanoscale wire Building Blocks," Science, 2001, v294, p1313–1317, V. Derycke, R. Martel, J. Appenzeller and Ph. Avouris, "Carbon Nanotube Inter- and Intramolecular Logic Gates," Nano Letters, 2001,v1n9, p435–456, and Sander J. Trans, Alwin R. M. Verschueren and Cees Dekker, "Room-temperature Transistor Based on a Single Carbon Nanotube," Nature, 1998, v393, p49–51, May 7.

The doping profile or material composition along the axial dimension of a nanoscale wire can be controlled, as shown in Mark S. Gudiksen, Lincoln J. Lauhon, Jianfang Wang, David C. Smith, and Charles M. Lieber, "Growth of nanowire superlattice structures for nanoscale photonics and electronics," Nature, v415 p617–620, February 2002, Yiying Wu, Rong Fan, and Peidong Yang, "Block-by-block growth of single-crystalline Si/SiGe superlattice nanowires," Nano Letters, v2 n2, p83–86, February 2002, and M. T. Bjork, B. J. Ohlsson, T. Sass, A. I. Persson, C. Thelander, M. H. Magnusson, K. Depper, L. R. Wallenberg, and L. Samuelson, "One-dimensional steeplechase for electrons realized," Nano Letters, v2 n2, p87–89, February 2002.

Furthermore, regular arrangements of nanoscale wires (parallel arrays of wires, crossed, orthogonal structures) are also known. A crossbar is usually defined as an array of switches that connect each wire in one set of parallel wires to every member of a second set of parallel wires that intersects the first set. Generally, the two sets of wires are perpendicular to each other. In the "on" position the switch connects the horizontal wire to the vertical wire, while in the "off" position the two wires remain disconnected. As a consequence, it is possible to store the switch state and implement switching in the area of a crosspoint. That is, the switch device itself holds its state. Therefore, crossbars in this technology can be fully populated with no cost in density. This is particularly beneficial in achieving the necessary defect tolerance. See, for example, U.S. Pat. No. 6,256,767 to Kuekes, Williams and Stanley.

Further, non-volatile memories can be built which are as tight as the nanoscale (sublithographic) wire pitch. See, for example, U.S. Pat. No. 6,128,214 to Kuekes, Williams, Stanley and Heath.

However, in order to program or read these crosspoint, a way to apply a control voltage to an individual nanoscale wire and to selectively read from a single nanoscale wire is needed. Therefore, a critical weak link in the construction of fully nanoscale memory and logic arrays is the construction of an interface that allows one to individually address the nanoscale wires from the microscale wires.

A scheme for bridging the microscale-nanoscale gap with a decoder based on randomly deposited gold nanoparticles has been disclosed in U.S. Pat. No. 6,256,767 cited above. The gold particles must be deposited over the region in which control and address wires intersect. This prior art approach relies on close control of the density of deposited particles, ideally targeting half of the points of intersection. Additionally, the approach relies on strongly quantized connection values for each intersection, while imprecisely localized gold nanoparticles could lead to intermediate values that complicate the discovery of wires that are connected. Consequently, the prior art approach comes with its own set of manufacturing challenges.

Therefore, a better way to individually address the nanoscale wires is needed. The present disclosure shows devices and methods able to control single nanoscale wires individually, wherein control is performed both at the microscale level and at the nanoscale level, so that individual crosspoints can be programmed and addressed.

Throughout the present disclosure, the term micron-scale (also microscale) will refer to dimensions that range from about 0.1 micrometer to about 2 micrometers in size. The term nanometer-scale (also nanoscale) will refer to dimensions that range from 0.1 nanometers to 50 nanometers (0.05 micrometer), the preferred range being from 0.5 nanometers to 5 nanometers.

SUMMARY OF THE INVENTION

The present invention provides methods and apparatus for controlling electric conduction on nanoscale wires. Microscale or nanoscale control wires are used to selectively activate one of a large number of nanoscale wires. Independent nanoscale wire addressability is provided by differently coded nanoscale wires.

In particular, a technique for bridging lithographic scale and sublithographic scale is provided, wherein a collection of lithographic scale wires is able to uniquely select a single sublithographic scale wire out of a collection of such sublithographic scale wires tightly packed at sublithographic pitches.

Also disclosed is a fabrication process for building and integrating sublithographic scale logic based on decorated (modulation-doped or superlattice heterostructure) nanoscale wires.

Also disclosed is a process for building sublithographic scale address decoders and a process for building sublithographic scale memories which can be addressed, read, and written from lithographic scale wires.

According to a first aspect, a method for controlling electric conduction on a nanoscale wire is disclosed, comprising: providing the nanoscale wire with a first plurality of controllable regions axially distributed along the nanoscale wire, said regions allowing conduction along the nanoscale wire when each region is either controlled with a signal having a value lower than a first threshold or is not controlled; and either controlling or not controlling said regions, to allow or to prevent electric conduction along the nanoscale wire.

According to a second aspect, a method for controlling electric conduction on a nanoscale wire is disclosed, comprising: providing the nanoscale wire with a first plurality of controllable regions axially distributed along the nanoscale wire, said regions allowing conduction along the nanoscale wire when each region is controlled with a signal having a value higher than a first threshold; and either controlling or not controlling said regions, to allow or to prevent electric conduction along the nanowire.

According to a third aspect, a method for controlling electric conduction on a plurality of nanoscale wires is disclosed, comprising: providing each nanoscale wire with a first plurality of controllable regions axially distributed along the nanoscale wire, said regions allowing conduction along the nanoscale wire when each region is either controlled with a signal having a value lower than a first threshold or is not controlled; providing a plurality of control wires, each control wire associated with a series of regions of the first plurality-and able to carry a control signal to control the series of regions; and providing control signals along the control wires to allow conduction on a single nanoscale wire of the plurality of nanoscale wires and to prevent remaining nanoscale wires of the plurality of nanoscale wires from conducting.

According to a fourth aspect, a method for controlling electric conduction on a plurality of nanoscale wires is disclosed, comprising: providing each nanoscale wire with a first plurality of controllable regions axially distributed along the nanoscale wire, said regions allowing conduction along the nanoscale wire when each region is controlled with a signal having a value higher than a first threshold; providing a plurality of control wires, each control wire associated with a series of regions of the first plurality and able to carry a control signal to control the series of regions; and providing control signals along the control wires to allow conduction on a single nanoscale wire of the plurality of nanoscale wires and to prevent remaining nanoscale wires of the plurality of nanoscale wires from conducting.

According to a fifth aspect, a method of addressing nanoscale wires in a plurality of nanoscale wires is disclosed, comprising: providing each nanoscale wire with controllable regions axially distributed along the nanoscale wire; and establishing the plurality of nanoscale wires by stochastically selecting the plurality of nanoscale wires from a larger set of nanoscale wires.

According to a sixth aspect, an arrangement is disclosed, comprising: a nanoscale wire having a first plurality of controllable regions axially distributed along the nanoscale wire, said regions allowing conduction along the nanoscale wire when each region is either controlled with a signal having a value lower than a first threshold or is not controlled; and means for controlling electric conduction along the nanoscale wire.

According to a seventh aspect, an arrangement is disclosed, comprising: a nanoscale wire having a first plurality of controllable regions axially distributed along the nanoscale wire, said regions allowing conduction along the nanoscale wire when each region of the first set is controlled with a signal having a value higher than a first threshold; and means for controlling electric conduction along the nanoscale wire.

According to an eighth aspect, a device is disclosed, comprising: a plurality of nanoscale wires, each nanoscale wire comprising a first set of controllable regions axially distributed along the nanoscale wire, said controllable regions allowing conduction along the nanoscale wire when each region is either controlled with a signal having a value lower than a first threshold or is not controlled; and a plurality of control wires, each control wire associated with a series of controllable regions and able to carry a control signal to control the series of controllable regions.

According to a ninth aspect, a device is disclosed, comprising: a plurality of nanoscale wires, each nanoscale wire comprising a first set of controllable regions axially distributed along the nanoscale wire, said controllable regions allowing conduction along the nanoscale wire when each region is controlled with a signal having a value higher than a first threshold; and a plurality of control wires, each control wire associated with a series of controllable regions and able to carry a control signal to control the series of controllable regions.

According to a tenth aspect, an apparatus for uniquely addressing a single nanoscale wire in a plurality of nanoscale wires is disclosed, comprising: means for providing each nanoscale wire with controllable regions axially distributed along the nanoscale wire; means for establishing a subset of nanoscale wires to be controlled by stochastically selecting the subset from the plurality of nanoscale wires; and means for selecting the single nanoscale wire among the subset of nanoscale wires by either controlling or not controlling the controllable regions on nanoscale wires of the subset of nanoscale wires.

According to an eleventh aspect, a memory array is disclosed, comprising: a first set of nanoscale wires; a second set of nanoscale wires intersecting the first set of nanoscale wires, intersections between the first set and the second set defining memory locations; wherein the memory locations are addressed by selecting one nanoscale wire of the first set of nanoscale wires and one wire of the second set of nanoscale wires; wherein nanoscale wires of the first set and nanoscale wires of the second set comprise controllable regions axially distributed along the nanoscale wires, a first set of the controllable regions exhibiting a first physical property, and a second set of the controllable regions exhibiting a second physical property, different from the first physical property; the memory array further comprising: a first plurality of addressing wires, each addressing wire of the first plurality associated with a series of regions of the first set of nanoscale wires; and a second plurality of addressing wires, each addressing wire of the second plurality associated with a series of regions of the second set of nanoscale wires.

According to a twelfth aspect, a circuit for selecting a nanoscale wire among a plurality of nanoscale wires is disclosed, comprising: microscale ohmic contacts, each ohmic contact connected to a different subset of the plurality of nanoscale wires for selecting a specific subset of the plurality of nanoscale wires; and addressing wires associated with the different subsets of the plurality of nanoscale wires, for selecting a nanoscale wire among the specific subset of nanoscale wires once the specific subset has been selected.

According to a thirteenth aspect, a memory array is disclosed, comprising: a plurality of nanoscale wires; a first set of microscale wires intersecting the nanoscale wires, intersections between the first set of microscale wires and the nanoscale wires defining address locations to address one or more nanoscale wires among the plurality of nanoscale wires; and a second set of microscale wires intersecting the nanoscale wires, intersections between the second set of microscale wires and the nanoscale wires defining memory locations.

According to a fourteenth aspect, a three-dimensional memory array is disclosed, comprising: a plurality of layers of nanoscale wires, intersections between nanoscale wires of a first layer and nanoscale wires of a second layer adjacent to the first layer defining memory locations; a plurality of microscale contacts connected to nanoscale wires of different layers of nanoscale wires; wherein the nanoscale wires comprise controllable regions axially distributed along the nanoscale wires, to allow addressing of the nanoscale wires, a first set of the controllable regions exhibiting a first physical property, and a second set of the controllable regions exhibiting a second physical property, different from the first physical property.

According to a fifteenth aspect, a process for manufacturing a logic arrangement having microscale and nanoscale wires is disclosed, comprising: providing microscale wires; determining an addressing portion on the microscale wires; transferring a first set of aligned nanoscale wires over the microscale wires; and transferring a second set of aligned nanoscale wires over the microscale wires and the first set of nanoscale wires, orthogonally to the first set of nanoscale wires.

The address decoder can be assembled without relying on lithographic patterning at nanoscale dimensions by randomly mixing differently coded nanoscale wires and enabling them to self-assemble into a parallel array at right angles to a pre-existing array of microwires. The approach according to the present disclosure realizes a microscale-to-nanoscale interface, bridging the gap from top-down lithographic processing to bottom-up self-assembly. The differently-coded nanoscale wire-based address decoder according to the present disclosure overcomes misalignment of nanoscale wires, allows the customization of nanoscale programmable computing arrays to personalize behavior and tolerate faults, and directly enables reliable nanoscale memory devices. Additionally, codes present in such a decoder can be discovered with reasonable efficiency. Differently from what disclosed in U.S. Pat. No. 6,256,767, the addressing scheme according to the present disclosure offers tighter address encoding, requires fewer novel processes, and uses standard semiconductor industry materials and dopants.

BRIEF DESCRIPTION OF THE DRAWINGS

The present invention will be understood and appreciated more fully from the following detailed description taken in conjunction with the drawings in which:

FIG. 4 shows a modulation-doped silicon nanoscale wire;

FIG. 5 shows a scheme for addressing nanowires;

DETAILED DESCRIPTION OF THE INVENTION

Modulation Doping

Figure 3:
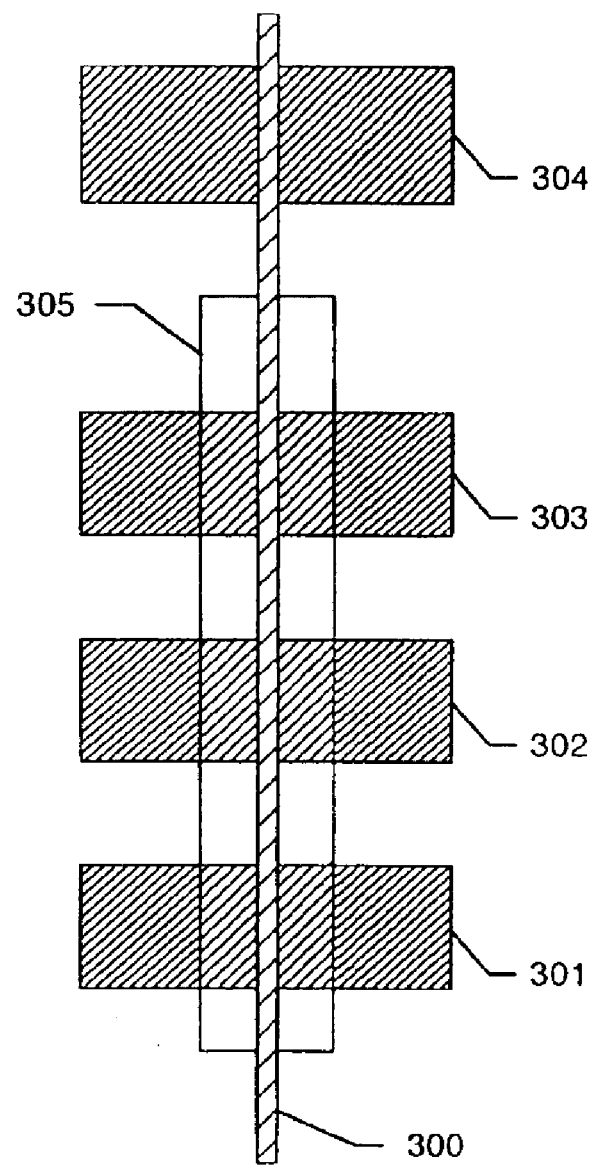
FIG. 3 shows an elementary module of a nanoscale combining logic.

Doped nanoscale wires act as Field-Effect-Transistors (FETs), as disclosed in Yu Huang, Xiangfeng Duan, Yi Cui, Lincoln Lauhon, Kevin Kim and Charles M. Lieber, "Logic Gates and Computation from Assembled Nanowire Building Blocks," Science, 2001, v294, p1313–1317. In particular, conduction along the length of a nanoscale wire can be controlled by an applied voltage field. For the depletion-mode p-type devices demonstrated to date, a low voltage (or no applied voltage) will allow good conduction, whereas a high applied voltage will evacuate carriers from the doped semiconductor preventing conduction along the nanoscale wire length. In this way, a combining logic can be built where several conductors cross a doped nanoscale wire, as shown in FIG. 3. In particular, FIG. 3 shows a nanoscale wire 300 crossing microscale control wires 301–303 and microscale ohmic contact 304 to a source voltage. Also shown is an oxide layer 305, which separates the nanoscale wire from the microscale wires. If all the inputs on the control microwires 301–303 are low, there is a conduction path from one side of the crossed nanoscale wire 300 to the other. If any of the inputs 301–303 are high, there will be no conduction path.

Also n-type nanowires can be manufactured. N-type nanowires would conduct only when the applied field has a voltage higher than a designated threshold, while low voltages would turn off conduction. Therefore, also in this case, a combining logic is provided. In this case, the control gates would have opposite polarity as in the p-type nanowires, so that all control inputs along an n-type nanowire should be high for conduction to occur.

Another way of decorating nanoscale wires is that of providing regions made of different materials. M. T. Björk, B. J. Ohlsson, T. Sass, A. I. Persson, C. Thelander, M. H. Magnusson, K. Depper, L. R. Wallenberg, and L. Samuelson, "One-dimensional steeplechase for electrons realized," Nano Letters, v2, n2, pp87–89, February 2002, describe and demonstrate a nanowire heterostructure alternating bands of InAs and InP. InAs and InP have different conduction properties (e.g. different conduction thresholds). Yiying Wu, Rong Fan, and Peidong Yang, "Block-by-block growth of single-crystalline Si/SiGe superlattice nanowires," Nano Letters, v2, n2, pp83–86, similarly show a banded heterostructure alternating Si and SiGe regions.

As already explained in the introductory section of the present application, it is already known how to control the doping profile or material composition along the axial dimension of a nanoscale wire.

Therefore, a silicon nanoscale wire can have different conducting thresholds as a function of the length along the nanoscale wire. The technique for controlling the doping profile of a nanoscale wire is called modulation doping. By controlling the doping profile the threshold voltage for the FET can be effectively controlled. That is, with high doping, it becomes very hard to deplete the carriers from the channel and stop conduction through the wire; consequently, the threshold voltage is high. With low doping, there are fewer carriers, allowing a low voltage to deplete the channel and stop conduction. Therefore, wires which are gateable in some regions but not gateable in others can be constructed. The growth along the length of the nanoscale wire is controlled by time. The nanoscale wire crystal grows by incorporating new atoms into its lattice at one end. To control the dopant profile, the dopant concentration in the nanoscale wire's growth environment is controlled over time. Consequently, the width of each doping region can be precisely controlled by controlling the rate of the growth reaction and the introduction of dopants into the growth atmosphere at the appropriate times. The dimensions of the doping regions are thus defined completely without lithographic processing.

FIG. 4 shows a modulation-doped silicon nanoscale wire 14 having three different regions 15, 16, and 17. Regions 15 and 17 are doped more strongly than region 16. Regions 15 and 17 are non-FET controlled regions. Region 16 is a FET controlled region. As a consequence, regions 15 and 17 conduct for a range of voltages which is wider than the range of voltages for which regions 16 conduct. For example, regions 15 and 17 can conduct for any applied voltage between 0 and 5V, and regions 16 can conduct for any applied voltage between 0 and 1V.

Modulation doping allows an address to be built into a nanoscale wire. Assuming that the nanoscale wires are depletion mode p-doped silicon nanoscale wires, current flows with no or low voltage applied, and the current flow can be stopped by applying a voltage which is higher than a threshold for a given doping. In case of n-doped silicon nanoscale wires, current flow when voltage higher than a certain threshold is applied, and the current flow can be stopped by applying a voltage which is lower than that threshold. The present disclosure develops an addressing scheme, where a plurality of microscale or nanoscale wires controls a plurality of nanoscale wires to allow selection of a nanoscale wire among the plurality of nanoscale wires.

With the ability to decorate nanoscale wires, for example by means of modulation doping, code words can be assigned to nanoscale wires. Each nanoscale wire is segmented into regions that are doped as either FET-controllable or non-controllable. When a coded nanoscale wire is aligned across a set of microscale wires, the flow of current through the nanoscale wire can be controlled. If a suitably low field is applied on all the FET-controlled regions, the nanoscale wire will conduct. If a high field is applied on any of the FET-controlled regions, the nanoscale wire will not conduct. Applying a high field on the non-FET controlled regions will not affect conduction. In one embodiment, the controlling voltages are provided by control microwires, which are at right angles to the addressed nanoscale wires. Therefore, address regions on a nanoscale wire can be differentiated from other regions on the nanoscale wire by controlling the voltages used in each region.

FIG. 5 shows an example of a scheme for addressing p-doped nanoscale wires, where nanoscale wires 21, 22 and 23 each comprise a low threshold doped region, 210, 220, and 230, respectively. Also shown in the figure are addressing lines 24, 25, and 26. If line 24 is driven with a low voltage and lines 25 and 26 are driven with a high voltage, nanoscale wire 21 will be selected. In particular, low-voltage driving line 24 will maintain the conducting state of nanoscale wire 21, thus selecting nanoscale wire 21, and high-voltage driving lines 25 and 26 will interrupt conduction of nanoscale wires 22 and 23 because the regions 220 and 230 will not conduct anymore due to the presence of a high voltage over the other two regions on these wires. Similarly, if line 25 is driven with a low voltage and lines 24 and 26 are driven with a high voltage, nanoscale wire 22 will be selected and nanoscale wires 21, 23 will be deselected. Finally, if line 26 is driven with a low voltage and lines 24 and 25 are driven with a high voltage, nanoscale wire 23 will be selected and nanoscale wires 21, 22 will be deselected. A similar scheme can be adopted for n-doped nanoscale wires.

A scheme for controlling a nanoscale wire will be called k-hot if a nanoscale wire has n potentially controllable regions, k of which are built to be controllable. In the provisional application 60/441,995 incorporated by reference to the present application, applicants have shown that in a k=n/2-hot scheme, to uniquely address N nanoscale wires, no more than n=1.1 $\log_2(N)$+3 address bits are needed. Consequently, for large enough arrays, the overhead associated with control lines becomes small compared to the size of the nanoscale logic or memory core it addresses. The overhead remains modest even if k-hot addressing is used with k much smaller than n/2.

In a different embodiment, nanoscale wires (instead of the microscale wires 24–26) are provided to control the nanoscale wires, thus providing a fully nanoscale system. For example, nanowire outputs from a nanowire array like the one disclosed in U.S. patent application Ser. No. 10/347,121, the contents of which are herein incorporated by reference in their entirety, can be used as the control/address inputs to the decoders according to the present disclosure.

Stochastic Assembly

A problem with nanoscale wires is that they can be assembled at a tight pitch, which is too small to allow selection of an individual nanowire by direct connection to lithographic wires. However, it is currently possible to assemble undifferentiated nanoscale wires into orthogonal sets of parallel wires. According to a preferred embodiment of the present invention, nanoscale wires coded in accordance with the modulation technique shown in FIGS. 4 and 5 and described above are first mixed together to produce a random ordering of coded nanowires and then assembled into sets of parallel wires; as a result the set of wires in a given array is selected stochastically. In the provisional application 60/398,943 filed on Jul. 25, 2002, applicants have shown that stochastic selection of coded nanoscale wires from a sufficiently large ensemble of such nanoscale wires ensures that almost all codes are unique. For example, a code space of $10^6$ different codes can be considered, where the number of wires having the same code is $10^6$, and the goal is that of building a small array with 10 wires in it. If each wire is selected randomly from the $10^{12}$ total wires, there is over a 99.995% chance that all 10 wires are unique. There is an even higher likelihood to get at least 9 unique wires. Therefore, coded wires can be randomly selected to obtain the desired independent nanoscale addressability, thus overcoming the need for deterministic selection of the nanoscale wires to include in a particular array.

The applicants have shown how to relate C and the number of nanoscale wires in an array (N) to the probability of achieving various uniqueness and distinctiveness guarantees, as shown, for example, in the provisional application 60/441,995 filed on Jan. 23, 2003.

For example, the applicants have shown that a code space $C=100\times N^2$ is sufficient to yield almost all unique codes; the chance of not achieving unique codes being at most 1%. Depending on the application, other code selection criteria may be important. Smaller code spaces can be achieved if a higher probability of non-unique codes is permitted. Similarly, if a few of the codes are allowed to be replicated, the probability of finding an acceptable collection can be high even with a smaller code space. The aforementioned analysis guarantees there are no duplicates. A separate analysis, also provided by the applicants, see provisional application 60/429,010, allows one to calculate the relationship between C, N, and d, where d is the number of distinct codes appearing in the collection of N wires allowing duplication. Using this selection criteria, it is possible to show that d>0.5×N when C=N for typical array sizes (e.g. N=10 to N=1000).

Therefore, according to the present disclosure, the nanoscale wires to be controlled comprise a unique sequence of regions or a uniquely addressable set of sequences of regions. If all the nanoscale wires are k-hot, then the unique sequence will be uniquely addressable.

The applicants have also shown that the number of control wires controlling the plurality of nanoscale wires is less than C, for example O(log(N)) or O($^k\sqrt{N}$) for any desirable k>=1.

Therefore, the present disclosure shows a method of uniquely addressing a single nanoscale wire in a plurality of nanoscale wires by providing each nanoscale wire with controllable regions axially distributed along the nanoscale wire, establishing a subset of nanoscale wires to be controlled by stochastically selecting the subset from the plurality of nanoscale wires, and selecting the single nanoscale wire among the subset of nanoscale wires by either controlling or not controlling the controllable regions on nanoscale wires of the subset of nanoscale wires.

Alternatively, all nanoscale wires or none of the nanoscale wires of the subset can be selected, by selecting addresses which connect them all to the supply or disconnect them all from the supply.

Alignment

The dimensional alignment between microscale wires and nanoscale wires shown in FIG. 5 is ideal. In practice, there may be no way of perfectly aligning the nanoscale wires with each other. Regardless of how the nanoscale wires are misaligned, they can be thought of as being misaligned by multiples of the width of the control microscale wires (the control bit pitch) and by fractions of such bit pitch. Therefore, every misalignment can be seen as a combination between a 'multiple' and a 'fraction' misalignment.

Misalignment by Multiples of the Control Bit Pitch

When the controlling microscale wires and the nanoscale wires are misaligned by multiples of the control bit pitch, one or more of the control microscale wires would not "cross" any portion of the corresponding "1" or "0"-doped region of the nanoscale wire if nothing were done to mitigate against this misalignment.

Figure 6:
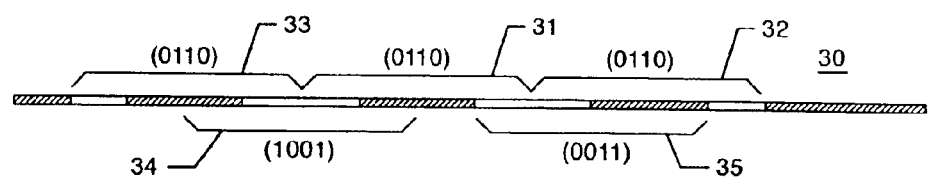
FIG. 6 shows a modulation-doped nanoscale wire with concatenated multiple copies of a code.

A first way of addressing this problem is that of repeating the code multiple times along the entire length of the nanoscale wire. FIG. 6 shows a nanoscale wire 30 carrying an n-bit n/2-hot code. In the example of FIG. 6, multiple copies 31, 32 of the base code have 33 been concatenated on the nanoscale wire 30. With a four-bit code, four microscale wires will be needed to address all the relevant bits on the nanoscale wires. Once the code is repeated along the nanoscale wire, every microscale wire will always be able to address a bit position on the nanoscale wire. A random misalignment between microscale wires and nanoscale wires can cause offset codes, different from the base code (0110) 33 to be selected, such as codes 34 or 35. However, this alternative selection is acceptable, because such offset codes (1001) or (0011) are still valid codes in the 2-hot code space of the present example.

However, coding along the entire length has the effect that extra control regions are located in places where there is no desire of controlling the nanoscale wire, such as the core of the memory array, so that a crossing line might unintentionally disable the nanoscale wire.

In some application, this may not matter. When the nanowire core is radially doped (see the 'Radial Modulation Doping' section disclosed below in the present application), the radial structure may be sufficient to protect the conduction in the core silicon from being turned off. In these cases, the address ends are exposed by an in-place etch after they have been assembled into the array. Thus only the intended address region has its radial structure removed and is directly exposed for control.

It may also be possible to avoid the unintentional turn-off effect by using lower operating voltages inside the memory as compared to the address control. If the operating voltage inside the memory is always below the threshold of the control regions, then the wires will always conduct inside the memory. The address control lines, which exist only outside of the memory, can then be driven to higher voltages, i.e. voltages which do exceed the threshold (Vctrl high>Vmoddope threshold>Vmemory high), so that they can control conduction.

An alternate way of addressing the problem which avoids raising the address control voltages is that of acting on the nanoscale wires by first masking off the area on the nanoscale wire where the microscale wires should be (addressing region), leaving exposed the portions of the nanoscale wires that are not in the addressing region, and then doing a bulk doping phase of the regions outside of the addressing region because of the masking, i.e. the only regions to be bulk-doped will be the regions not acting as addressing regions. In this way the addressing region will be self-aligned because only the addressing region will be controllable.

Figure 7:
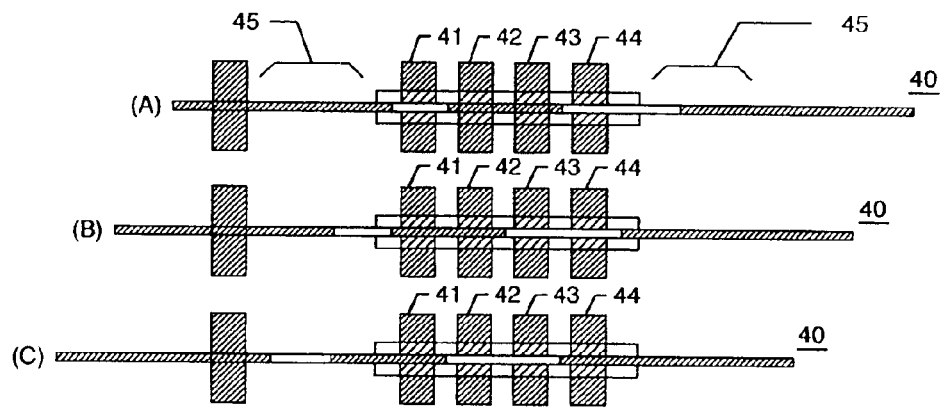
FIGS. 7(A)–7(C) show a modulation-doped nanoscale wire with a partially repeated code.

A third way of addressing the problem is to partially repeat the code (or a fraction thereof) for a distance equal to the expected misalignment. This is shown in FIGS. 7(A)–7(C), which all show a nanoscale wire with a partial repeat of 2 bits to tolerate a +/−1 bit displacement. This means that the last two bits of the 0110 code are repeated at the left of the code, and the first two bits of the 0110 code are repeated at the right of the code. FIG. 7(A) shows a case where there is no misalignment and the code 0110 is controlled by the microscale wires 41–44. FIG. 7(A) also shows the extension of the alignment guard region 45. FIG. 7(B) shows a case where the code on the nanoscale wire 40 is moved one bit position to the left, and the code 1100 is controlled by the microscale wires 41–44. FIG. 7(C) shows a case where the code on the nanoscale wire is moved two bit positions to the left, and the code 1001 is controlled by the microscale wires 41–44. In this third addressing method, the fact that the nanoscale wire 40 conducts across a coded region when there is no field applied is exploited. In this way, the controllable bit code regions which end up on either side of the control microscale wires 41–44 will continue to allow signal conduction.

Misalignment by Fractions of the Bit Pitch

In order for a microscale wire to control a coded region of a nanoscale wire, there must be a sufficient overlap between the field of the microscale wire and the doped, controllable region of the nanoscale wire.

Figure 8:
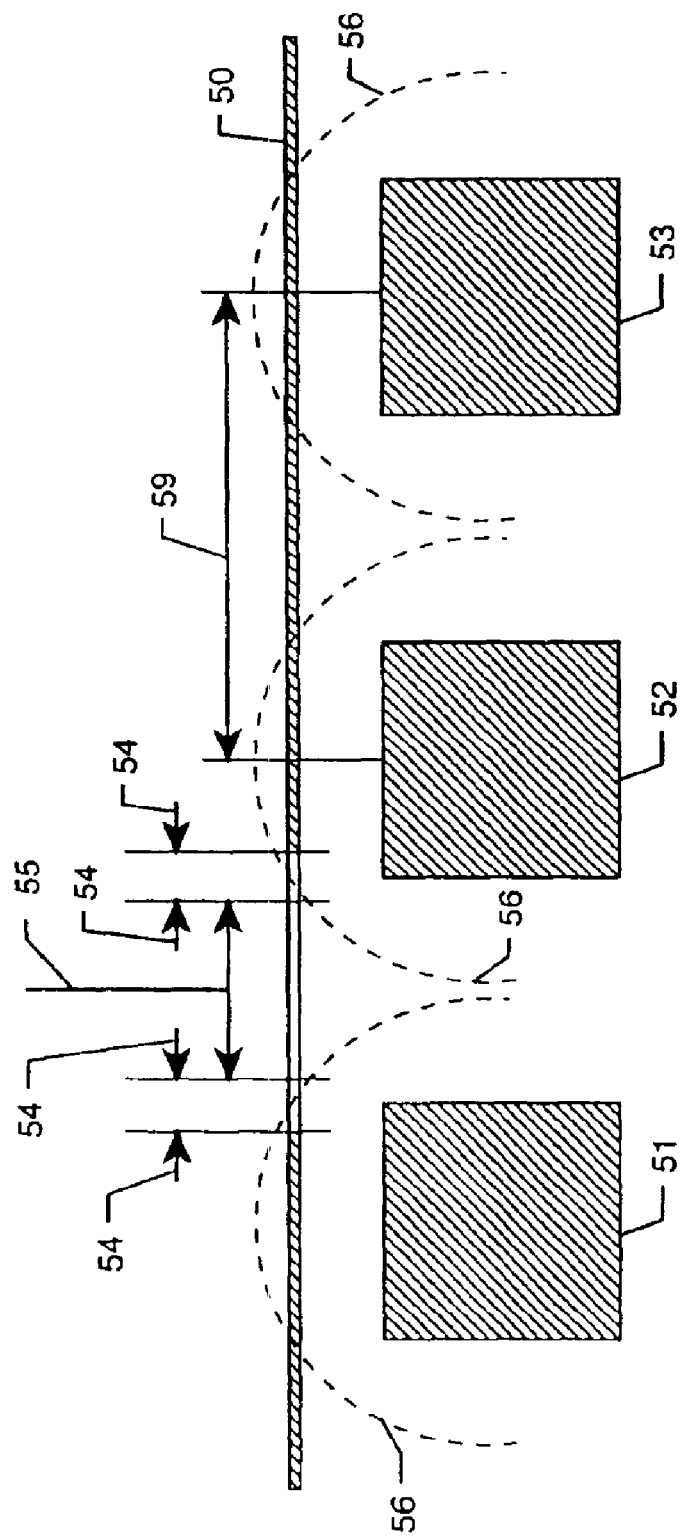
FIG. 8 shows a cross-sectional view of a microscale-nanoscale arrangement.

FIG. 8 shows a cross sectional view of three microscale wires 51–53 and a nanoscale wire 50 above the microscale wires 51–53. In order to stop conduction on the depletion-mode nanoscale wire 50, carriers have to be depleted only in a small region along the axis of the nanoscale wire 50, probably an overlap region 54 (Woverlap) less than 5 nm, i.e. less than the order of a diameter or two of the nanoscale wire 50. The extent of the region Woverlap depends on the domain of influence 56 of the microscale wire field. Therefore, overlap regions having an extension between 0 and Woverlap may not work, because they may only partially turn off conductions, resulting in intermediate current flow levels. FIG. 8 shows a non-controllable region 55 between the fields of adjacent microscale control wires, such as microscale wires 51 and 52. In the preferred embodiment according to the present invention, the length of the doped, controllable region is equal to the length of the non-controllable region of the nanoscale wire plus 2×Woverlap. In this way, the presence of a region under one of the adjacent control fields having a length which is at least Woverlap is always guaranteed, so that the region will be controlled either by the left or the right adjacent microscale wire. There is an undesired chance, of course, that a region having a length between 0 and Woverlap is disposed both over the left and the right adjacent microscale wire. The probability for this to occur can be made small, typically less than 10%.

Therefore, the misalignment between the control wires and regions on the nanoscale wires associated with the control wires by a distance less than a width of the microscale wires is tolerated by engineering or designing the length or profile of the controllable region.

FIG. 8 shows an example where the controllable region overlaps two fields. When the controllable region overlaps multiple fields, no code in the normal k-hot address space will enable conduction along the nanowire. This is good because it guarantees that misaligned nanowires will, at least, not interfere with the operation of the correctly aligned nanowires.

Using codes outside of the normal k-hot code space may still allow the wire to be addressed. For example, a misaligned 1100 code may have its third position controlled by both the second and third wire, and its fourth position controlled by both the third and fourth wire. A 1000 address (i.e. an address outside the 2-hot code space) will select this wire and can be used if there is no 1100 and no 1001 code in the array. However, if either 1100 or 1001 are present in the array, it will not be possible to select such 1000 wire without also selecting on of the other codes. Consequently, for most applications the preferred embodiment will simply treat these wires as non-accessible.

Use of Nanowires for Address Control

In a different embodiment, nanoscale wires are provided to control the nanoscale wires, thus providing a fully nanoscale system, as already explained above. This is useful when the addresses to the decoder come from nanoscale circuitry, such as a nanoPLA.

Figure 9:
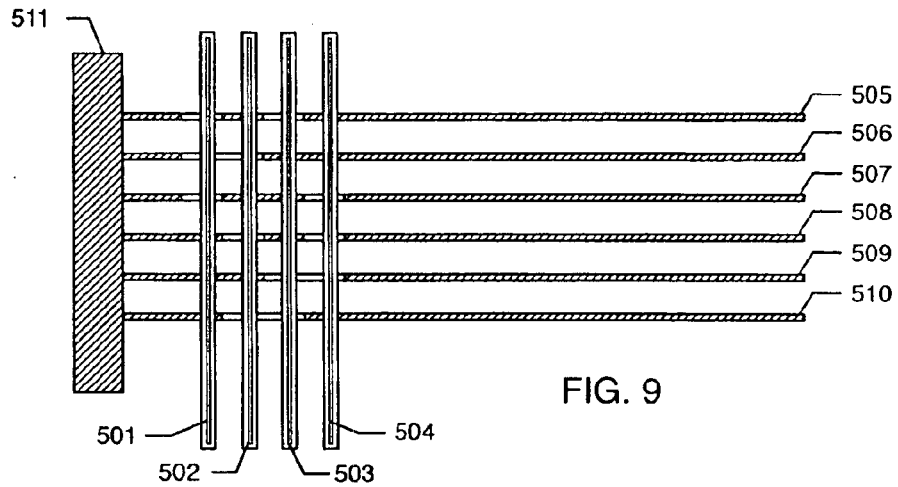
FIGS. 9 and 10A–10D show an embodiment where a first set of nanoscale wires is used to control a second set of nanoscale wires.

FIG. 9 shows this embodiment, where oxide coated nanowires 501–504 control a plurality of nanowires 505–510. The nanowires 505–510 are connected to an ohmic contact 511 to a source, not shown in the Figure. Oxide separation between the two sets of nanowires is obtained by means of an oxide shell around the control wires, as also shown in the figure. Alternatively, oxide separation can be obtained with lithographic definition and growth between the first layer of nanowires and the second layer of nanowires, or with an oxide shell around the nanowires 505–510 covering the control region area, i.e. the area crossed by the control nanowires 501–504.

It should be noted that, in the embodiment of FIG. 9, the width of the control wire pitch is the same spacing as the nanowire pitch (Wbitpitch), so that the control overlap region Woverlap should be roughly the same size as Wbitpitch. This may require an alignment strategy which is different from that shown in FIGS. 6–8.

A first step is that of guaranteeing that the coded region of the nanoscale wires 505–510 is at least Wbitpitch+2*Woverlap<2*Wbitpitch. In this way, every coded region will always be controlled by some nanoscale wire.

Additionally, control regions on the nanowires 505–510 are spaced at twice the ordinary spacing, i.e. two physical bit positions, and twice as many control nanowires are used. Even with this added amount of control nanowires, the number of control wires remains logarithmic in the number of wires in the decoder.

Figure 10A:
Figure 10B:
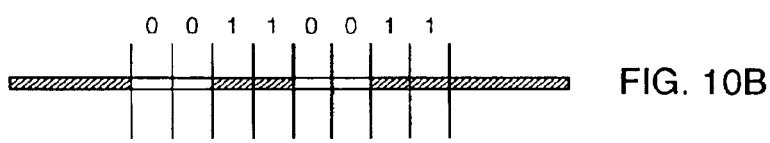
Figure 10C:
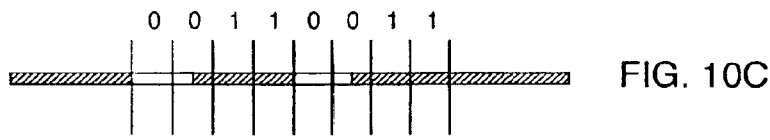

FIGS. 10A–10C show this embodiment with more clarity. FIG. 10A shows the original coding, where the vertical lines show the bit regions and line spacing, and are one bit pitch apart. FIG. 10B shows an example where double coding has been performed and the length of the coded region is exactly 2 bit pitches. FIG. 10C shows another example, where the length of the coded region is just under 2 bit pitches, but at least Wbitpitch+2*Woverlap, in accordance with the expression above.

Figure 10D:
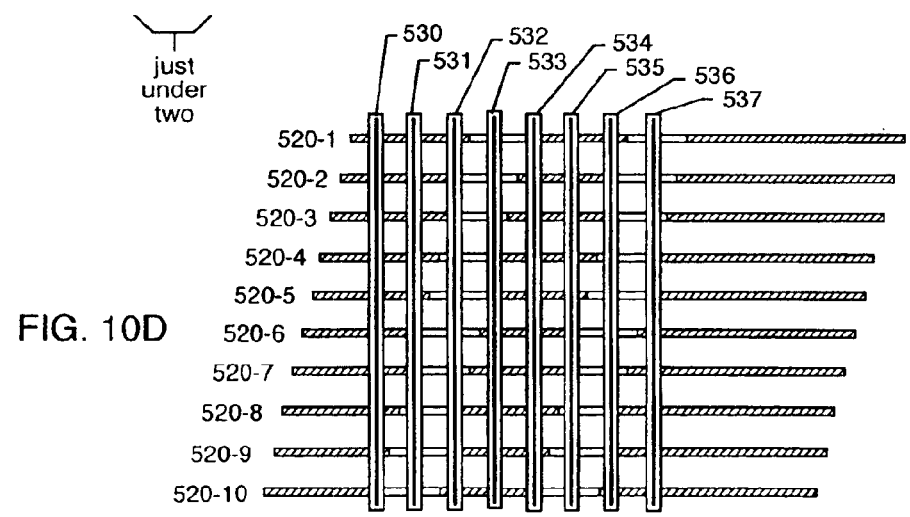

FIG. 10D shows ten offsets 520-1 . . . 520-10 of the same nanowire 520, where each control region satisfies the expression above. Each of the offset lines will be enabled according to the following table

| | |
|---|---|
| 520-1 | 11100110 |
| 520-2 | 11001100 |
| 520-3 | 11001100 |
| 520-4 | 11001100 |
| 520-5 | 11001100 |
| 520-6 | 10011001 |
| 520-7 | 10011001 |
| 520-8 | 10011001 |
| 520-9 | 10011001 |
| 520-10 | 00110011 |

It can be noted that the first five offsets can be addressed with the code 01000100, the following four offsets can be addressed with the code 10001000 (i.e. the previous 01000100 code with a 1-bit rotation) and the final offset with the code 00010001 (i.e. another bit rotation from the previous code). Therefore, the present invention discloses a method for addressing nanowires by means of control nanowires according to the following steps:
1) providing the nanowires to be controlled with coded regions having a length Wbitpitch+2*Woverlap<2*Wbitpitch
2) Doubling the coding on the nanowires to be controlled, i.e. spacing the control regions on the nanowires to be controlled at twice the ordinary spacing
3) Using a code on the control nanowires where "11" occurrences in the code of the nanowire to be controlled are replaced by "01" or "10" and also providing codes which are a rotation of that code.

Memory Application

A programmable memory is also provided, addressed by means of the above disclosed decoder. Techniques for placing non-volatile memory bits at the crosspoints of a nanoscale wire array are already known in the art, as already mentioned in the background section of the present application.

Nanoscale Memory Array

Figure 11:
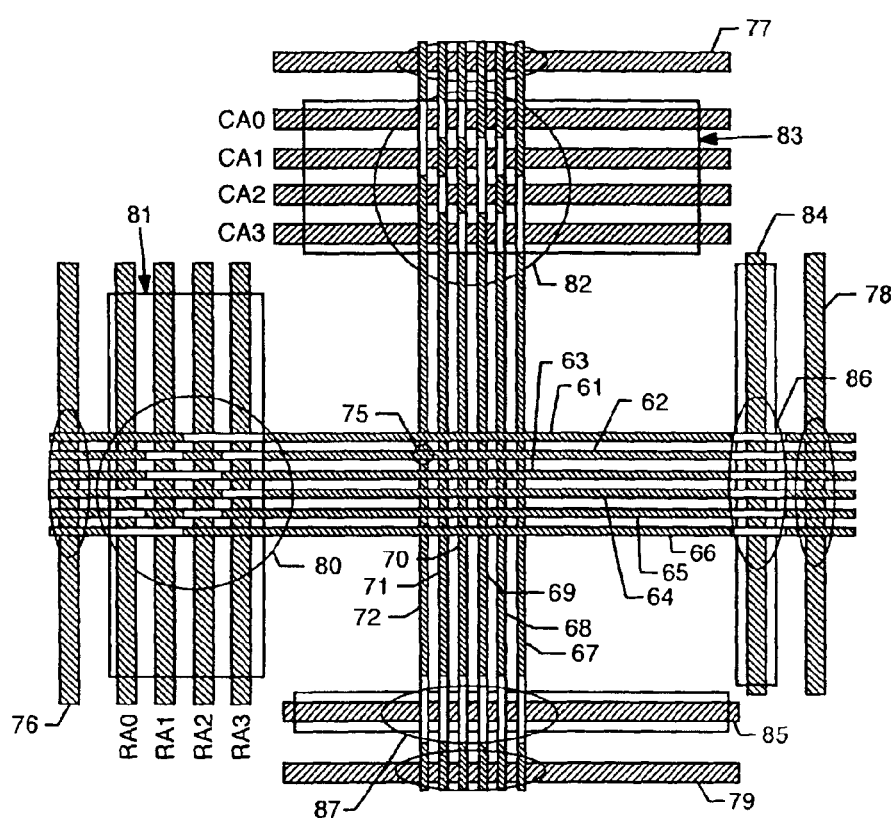
FIG. 11 shows a nanoscale memory array interfaced using address decoders formed by decorated nanoscale wires.

FIG. 11 shows a nanoscale memory array interfaced using modulation-doped address decoders shown with only a few nanoscale wires for clarity. In particular, an array of 6×6 nanoscale wires is shown. A typical array size would have 100–1000 nanoscale wires addressed by only 24–30 microscale wires.

FIG. 11 shows addressable row nanoscale wires 61–66 and addressable column nanoscale wires 67–72. Using these addressable nanoscale wires, exactly one row nanoscale wire, such as nanoscale wire 62, and one column nanoscale wire, such as nanoscale wire 72 can be enabled, so that a programming voltage can be applied across a single crosspoint, such as crosspoint 75. Row programming voltage is provided by ohmic contact 76, while column programming voltage is provided by ohmic contact 77. Ohmic contacts 78 and 79 will provide row and column nominal voltages, respectively.

Therefore, crosspoint 75 will have both its row nanoscale wire 62 and column nanoscale wire 72 pulled to the programming voltage, thus showing a greater voltage differential than other crosspoints where only one or none of the nanoscale wires are pulled to the programming voltage. The crosspoints can also be arranged to act as diodes to avoid parasitic paths in a partially programmed array.

In the writing phase, selection of the row nanoscale wire 62 occurs by means of the modulation-doped decoder 80, comprising row microscale wires RA0–RA3 and the modulation-doped regions of the nanoscale wires 61–66, separated from the microscale wires RA0–RA3 through an oxide layer 81. Selection of the column nanoscale wire 72 occurs by means of the modulation-doped decoder 82, comprising column microscale wires CA0–CA3 and the modulation-doped regions of the nanoscale wires 67–72, separated from the microscale wires CA0–CA3 through an oxide layer 83. Therefore, the addressing wires allow a memory location to be set into one of a plurality of states.

In the reading phase, data bits are read by placing appropriate control bits to enable only a single row and column. A high voltage is placed on the common column line 77, and the voltage on the common row line 76 is observed. In this manner, only the intended crosspoint, for example crosspoint 75, sees both a high input on its column line 77 and a low resistance path to the common row line 76. If the crosspoint is programmed "ON", it will be possible to observe the current flowing out of the selected row line, perhaps raising the row line voltage. If the crosspoint is programmed "OFF", there will be less current flow.

With the simple read operation described, the read operation can become slow for large arrays. In particular, the diode memory points can couple a column read line (one of columns 62–72) to every row line (lines 61–66), forcing the column line to charge all rows in order to read a single bit. In this way, the read time will scale as the product of the number of rows and columns rather than the sum.

To avoid the above worst-case coupling capacitance for read operations, it is possible to make the read time scale as sum of the row and column lines rather than the product. All the row lines 61–66 are first precharged to the high read voltage. This is one of the advantages of having an address that selects all the nanowires simultaneously. The row lines can be driven in parallel, so that the precharge time takes no more time than the time for charging a single row line. After that, the single row line that has to be read, is discharged. Then, the read operation is performed as before. Now, the row lines associated with bits which do not have to be read are already charged high and will not need to be charged while driving the intended row line.

The memory array also comprises microscale wires 84, 85 allowing the nominal row or column voltage to be disconnected, respectively. In particular, both microscale wires 84 and 85 comprise a FET controllable region 86, 87, allowing such voltage to be disconnected.

Hybrid Control Memory

A drawback of the memory described above is that it requires a very large address space and hence requires a very large collection of differently coded nanoscale wires. For example, in the case of a 500×500 array, a code space of 25 million nanoscale wires would be required.

However, a more modest number of nanoscale wires can be used by means of a hybrid control scheme, where a set of nanoscale wires is first selected by a microscale wire ohmic contact without use of a modulation-doped decoder, and then the selected set of nanoscale wires is addressed by microscale wires, as shown in FIGS. 12–15.

Figure 12:
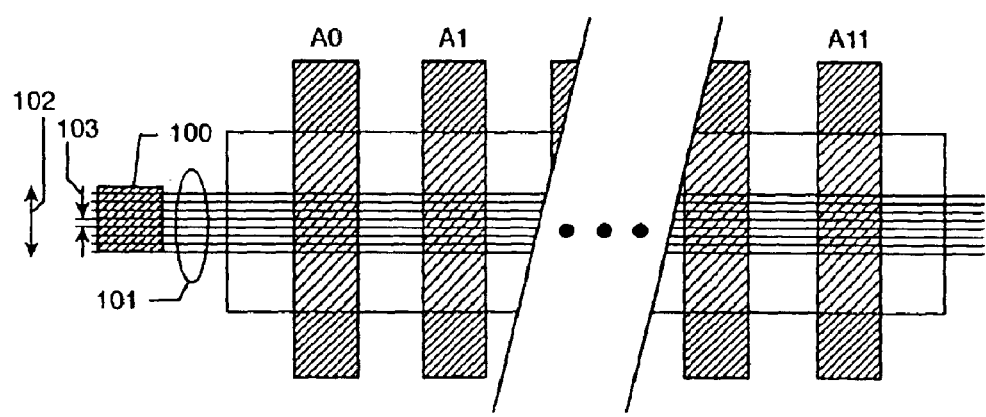
FIG. 12 shows a hybrid control memory arrangement.

In FIG. 12, an ohmic contact 100 selectively energizes the endpoints of a collection of nanoscale wires 101 at the lithographic scale. If the ohmic contact 100 has a width 102 of 90 nm and the nanoscale wires have a width 103 of 10 nm, the ohmic contact will be able to uniquely address a group of 9 nanoscale wires. Such nanoscale wires could then be addressed by a 12-bit code through the twelve microscale wires A0 . . . A11. In particular, a 6-hot, 12-bit code has 942 code words. With 942 code words, there is over a 96% probability that all 9 wires in a bundle will have unique codes.

A problem with this embodiment is the microscale wire pitch, i.e. the necessary minimum distance between the microscale wires, see, for example, element 59 in FIG. 8. The present invention addresses such problem by means of the embodiment of FIG. 13, where staggered adjacent microscale wire contacts 110–112 are provided. By staggering adjacent microscale wire contacts, the tight nanoscale wire pitch can be maintained, perhaps losing not more than one wire at the edge of each microscale wire group.

Figure 14:
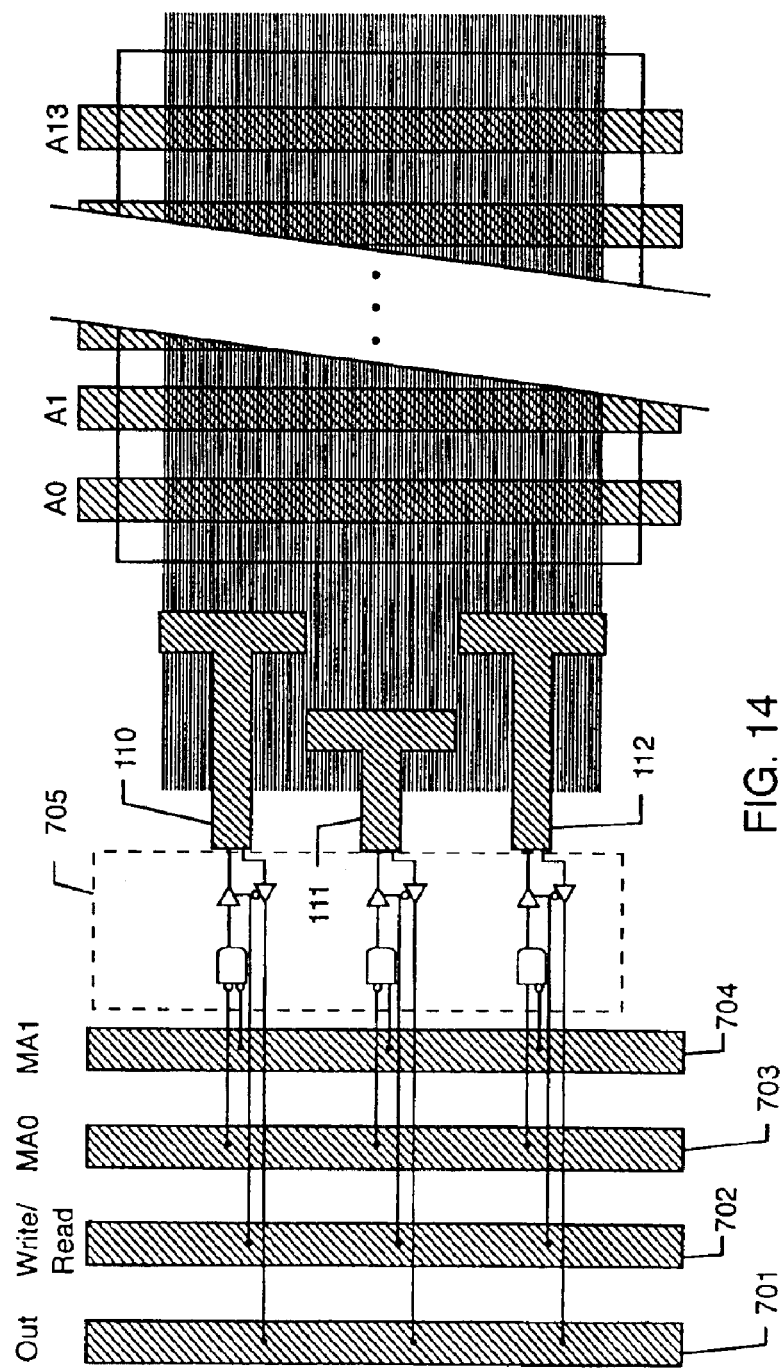
FIGS. 14 and 15 show methods of interfacing staggered ohmic contacts with microscale wires.

FIG. 14 shows a first embodiment for controlling staggered ohmic contacts, where four microscale wires 701–704 and an interface logic 705 are provided. Microscale wire 702 controls whether the operation is a write operation or a read operation, thus allowing communication either to the ohmic contacts or from the ohmic contacts. If the operation is a read operation, the signal is read on the output wire 701. The contacts 110–112 are selected by means of the wires 703, 704. Usually, N contacts will require $\log_2 N$ selection wires.

Figure 15:
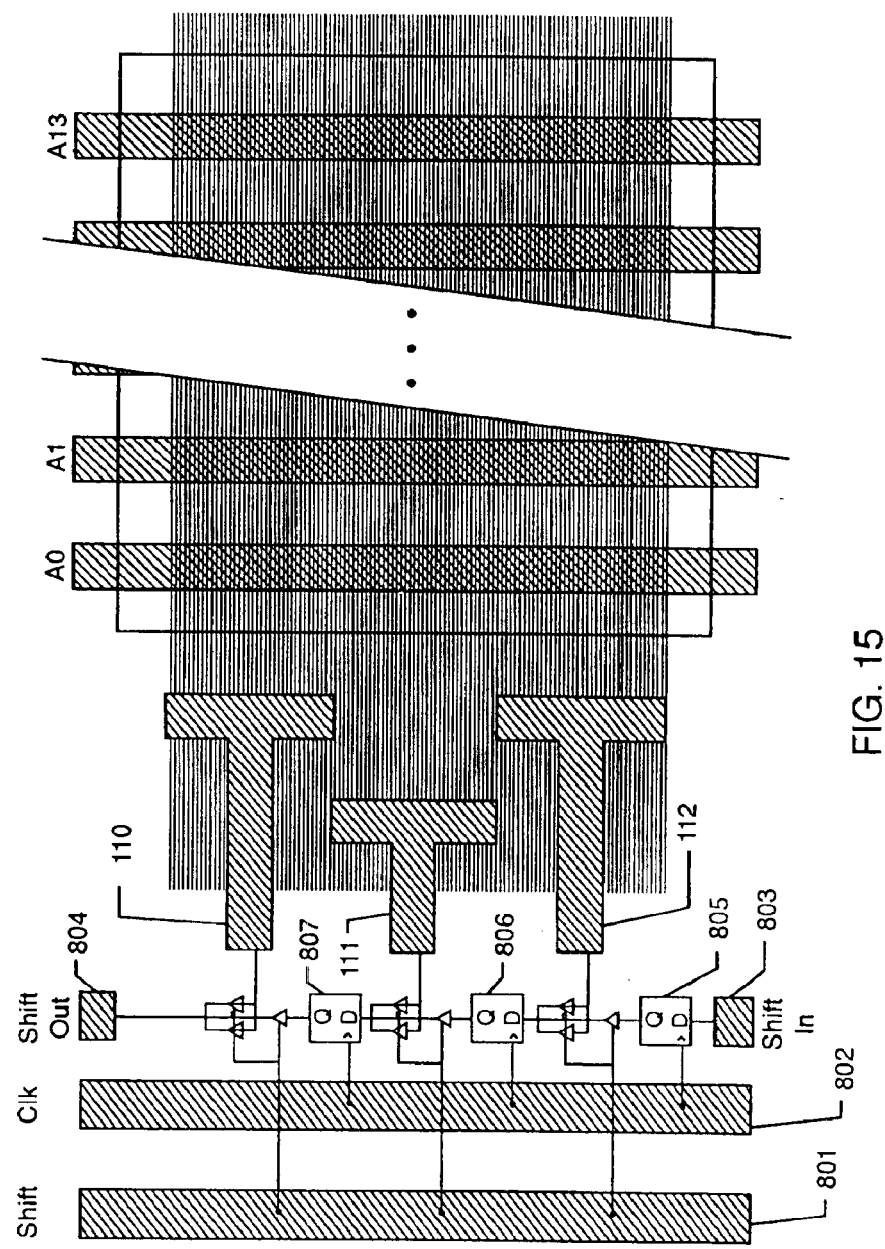

FIG. 15 shows a second embodiment for controlling staggered ohmic contacts, in case compact access to the decoder is more important than high-speed access. In this embodiment, only microscale wires 801–804 are needed. Microscale wire 801 carries the shift signal, microscale wire 802 carries the clock signal, microscale wire 803 carries the shift input signal, and microscale wire 804 carries the shift output signals. With a higher number of contacts, more time and a higher number of flip-flops are required, but not a higher number of microscale wires.

Also in the hybrid control case, control wires can either be microscale wires (as shown) or nanoscale wires.

One-Dimensional Memory

The embodiment of FIG. 11 shows a two-dimensional memory. The present disclosure also provides a one-dimensional memory embodiment, using a single nanowire layer, as shown in FIG. 16.

Figure 13:
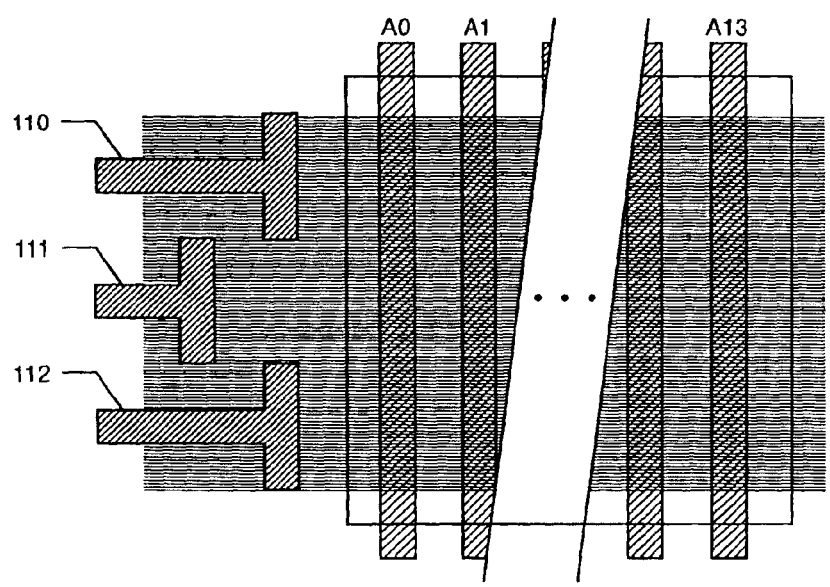
FIG. 13 shows a hybrid control memory arrangement with staggered ohmic contacts.
Figure 16:
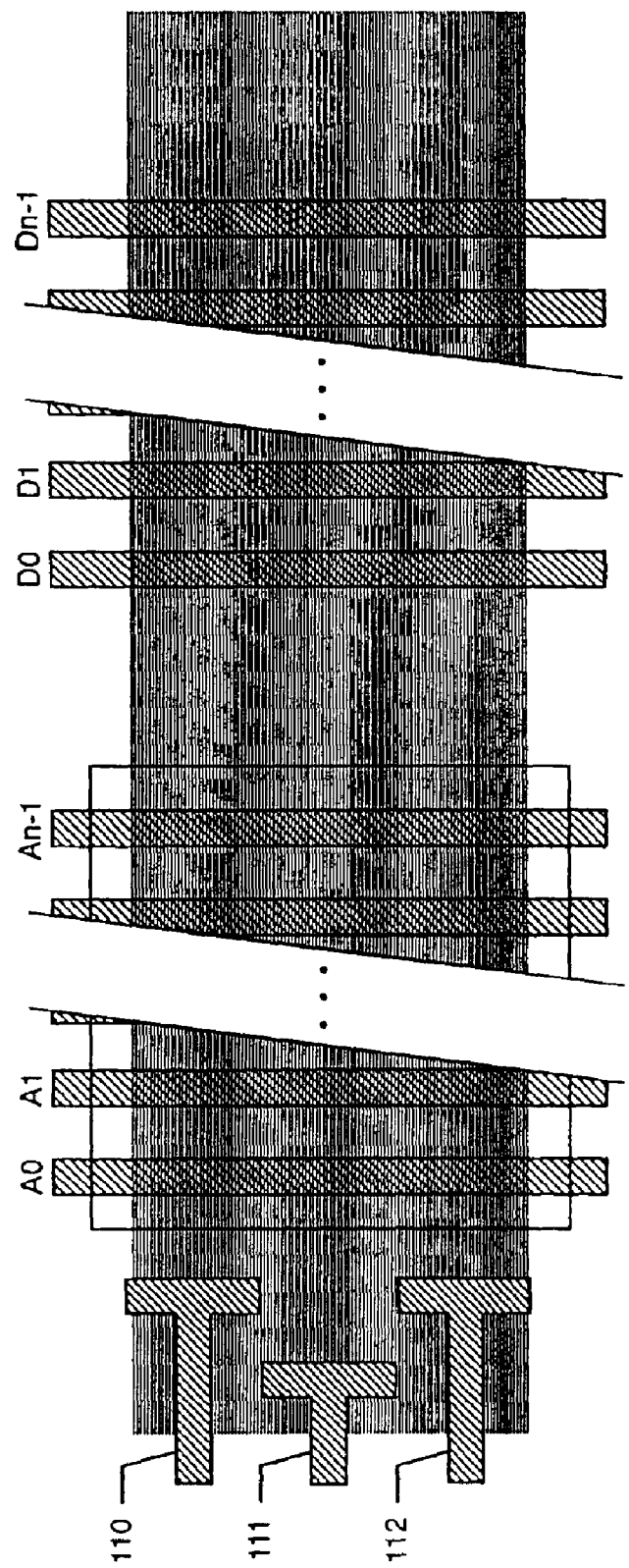
FIG. 16 shows a one-dimensional memory arrangement.

FIG. 16 is similar to FIG. 13, and shows staggered microscale wire contacts 110–112 energizing the endpoints of a collection of nanoscale wires, and address microscale wires A0–An-1. In addition, memory microscale wires D0–Dn-1 are provided.

Microscale wires D0–Dn-1 serve the same role as the vertical decoder 82 in the 2D-memory of FIG. 11. To perform a write, a suitable voltage is put on the wires D0–Dn-1, the appropriate ohmic group contact, and the A0–An-1 lines are used to select a single nanoscale wire and place a voltage on it. Therefore, a voltage differential between the selected nanoscale wire and the D0–Dn-1 lines will be established, allowing a crosspoint at the junction between the selected nanoscale line and the associated Di line to be programmed. A single Di line can be decoded and driven in the same way a standard, lithographic decoder is driven. In addition, since direct microscale control is present in the 1D case, multiple bits can be programmed to the same setting simultaneously. This is done by simply driving to the appropriate programming voltage multiple of the Di lines to be programmed and then program them all at once, similarly to the way multiple bits are written in a conventional memory. The differences from a conventional method of programming would include the fact the set of bits programmed must be to the same state and that, given suitable microscale control, any subset can be programmed. Therefore, with two write cycles (or m write cycles if a crosspoint has m states), any word D0 . . . Dn-1 can be programmed. In the first cycle, the entire word D0 . . . Dn-1 associated with the selected nanowire is written to one state (ON, for example). In the second cycle, all the bits which should be OFF are programmed into the OFF position.

Reading cycles have a similar behavior. Once only one of the Di's is driven to a 'high' value, and conduction in a single nanowire is enabled using the Ai's, the value associated with the Di, Ai crosspoint can be read on the ohmic contact output for each ohmic contact group.

Alternatively, multiple bits at a time can be read out. In particular, the 'high' value is driven into the associated ohmic contact group and through the Ai's onto a single nanoscale wire thus charging, through the programmed crosspoints, all of the Di's with associated, programmed crosspoints. In this way, the entire D0 . . . Dn-1 word will be read in one cycle. However, it will be slower per read operation, since the nanoscale connection will need to drive the capacitance of n microscale wires. The way the memory is run for the read operation will need to be decided during fabrication as it will determine the orientation of the diode rectification in the memory, i.e. from microscale Di's to nanoscale wires in the first case versus from nanoscale wires to microscale Di's in the second case.

Three-Dimensional Memory

Figure 17:
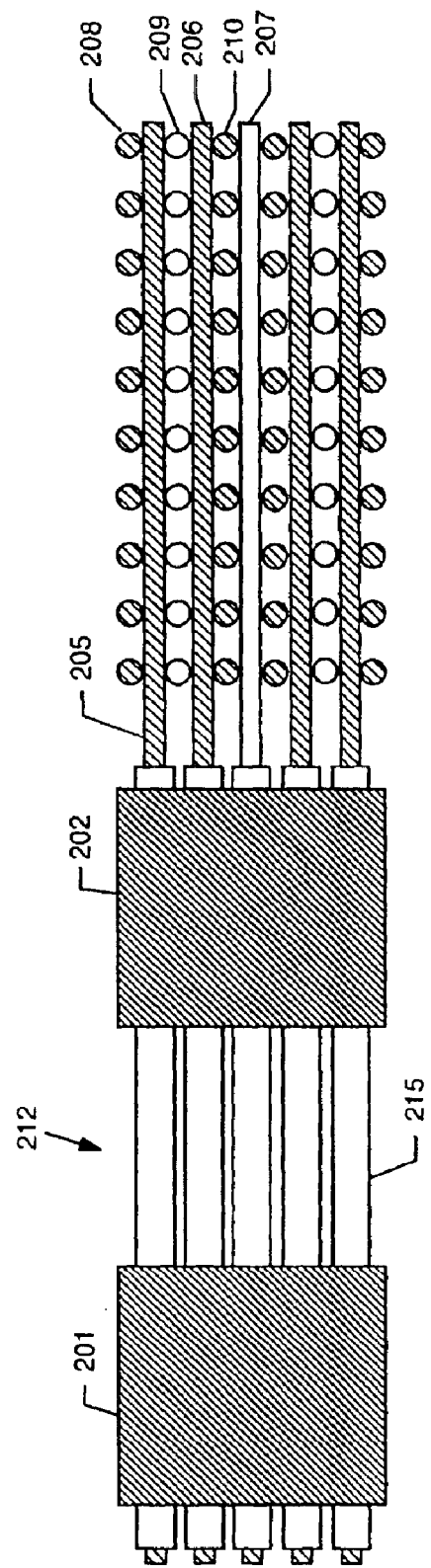
FIGS. 17 and 18 show a three-dimensional memory arrangement.
Figure 18:
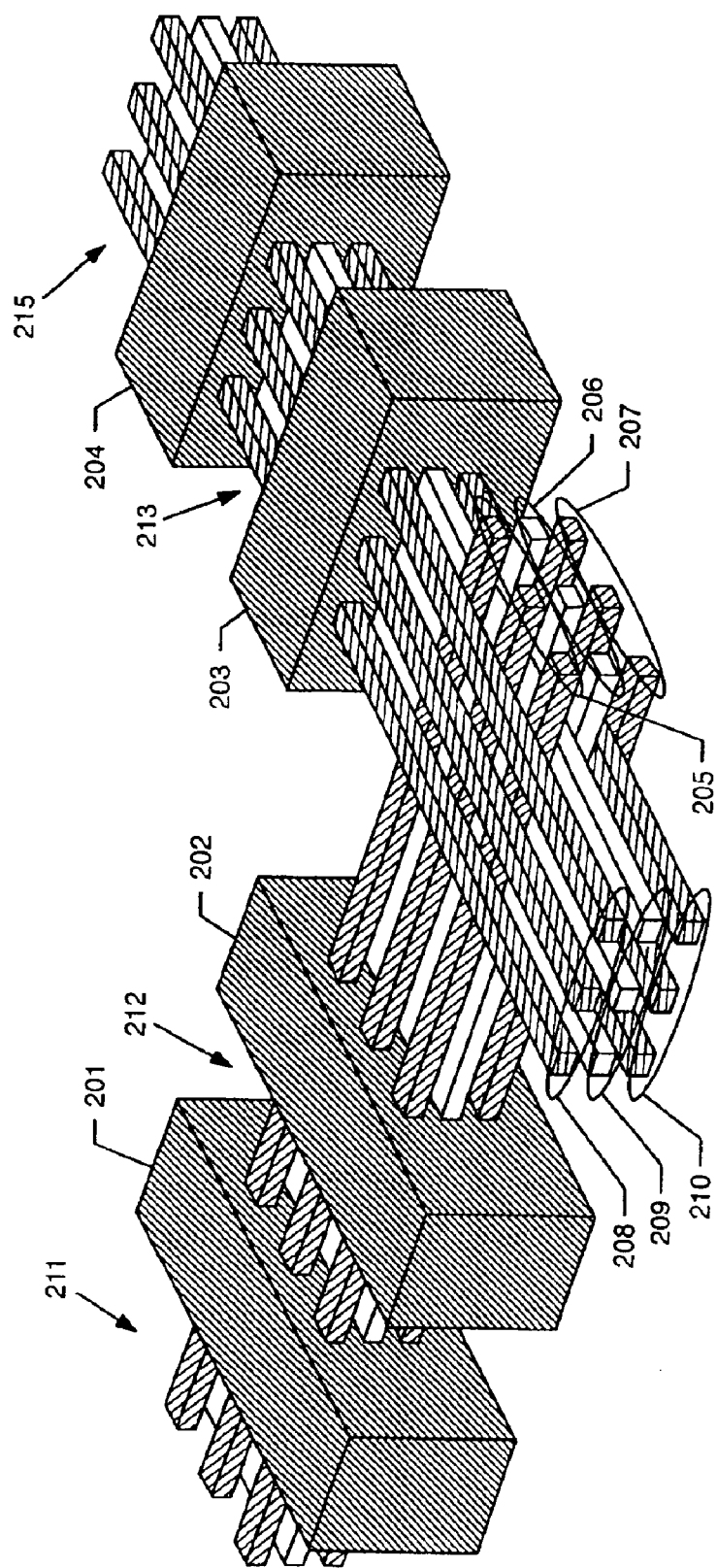

FIGS. 17 and 18 show a schematic cross-sectional view and a perspective view, respectively, of a 3D-memory embodiment. Microscale wires 201–204 are provided, together with a first set of layers 205–207 of nanoscale wires and a second, orthogonal, set of layers 208–210 of nanoscale wires. Similarly to the 2D embodiment in FIG. 11, the decoding regions for each layer are located in the regions 211–214. The nanoscale layers in the regions 211–214 are covered by an oxide sheath 215, to cover the modulation doped decode regions.

The interesting consequence of the 3D-memory embodiment is that microscale wires are shared by nanowires on different layers of the memory. Using the same stochastic selection techniques of the 2D case, a set of uniquely coded wires is assembled for each common group of microwire contacts, allowing each wire in a vertical plane to be uniquely selected.

In a preferred embodiment, like the one shown in FIG. 17, the layers of nanoscale wires are so arranged to define repeated occurrences of adjacent sets of layers comprising a first nanoscale layer 208, a second orthogonal nanoscale layer 205 defining memory locations in cooperation with the first nanoscale layer 208, and an insulating nanoscale layer 209.

Radial Modulation Doping

In addition to modulation doping along the axis of the nanoscale wire, also techniques for modulating the doping along the radius of a nanoscale wire are known, as disclosed in Lincoln J. Lauhon, Mark S. Gudiksen, Deli Wang and Charles M. Lieber, "Epitaxial core-shell and core-multishell nanowire heterostructures," Nature v420, pp57–61, November 2002. An interesting consequence of the radial modulation doping technique is that the nanoscale wire can both be radially and axially modulation doped. In particular, a predetermined section of a nanoscale wire can either be: 1) not doped; 2) axially doped; 3) radially doped; or 4) axially and radially doped. The memory shown in FIGS. 11–18 can use both modulation doping techniques for the nanoscale wires.

More specifically, the whole nanowire gets radially doped during construction. Later, after assembling the wires onto the substrate, the radial sleeve is selectively etched off from sections of the radially doped nanowire. In this way, nanowires that have a first set of portions which are axially and radially doped and nanowires that have a second set of portions that are only axially doped are obtained. Therefore, the first and second portions are advantageously determined after construction and after it has been determined how the nanowire will align with the lithographic substrate.

Nanoscale Wire Structure in the Memory Embodiment of FIG. 11

With reference to the vertical nanoscale wire, such as the nanoscale wire 72 shown in FIG. 11, several distinct regions can be observed:
a) a region to be ohmically connected to the microscale wire 77;
b) an address region which needs to be separated my means of an insulator (such as the insulator 83) from the microscale address lines CA0–CA3;
c) a core region containing information to be written or read, such as the region crossed by the horizontal nanoscale wires 61–66;
d) a controllable region which needs to be separated by means of an insulator from the microscale wire 85; and
e) a region to be ohmically connected to the microscale wire 79.

A similar observation can be done with reference to a horizontal nanoscale wire, such as the nanoscale wire 62.

It should be noted that only one of the two (orthogonal) wire sets in an array will need to be radially doped for the memory structure.

Fabrication Process in the Case of Axially Doped Nanoscale Wires

Figure 2:
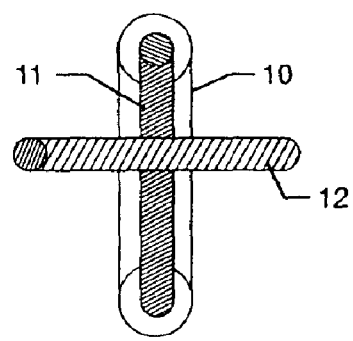
FIG. 2 shows a schematic perspective view of a prior art nanotube FET arrangement.
Figure 19:
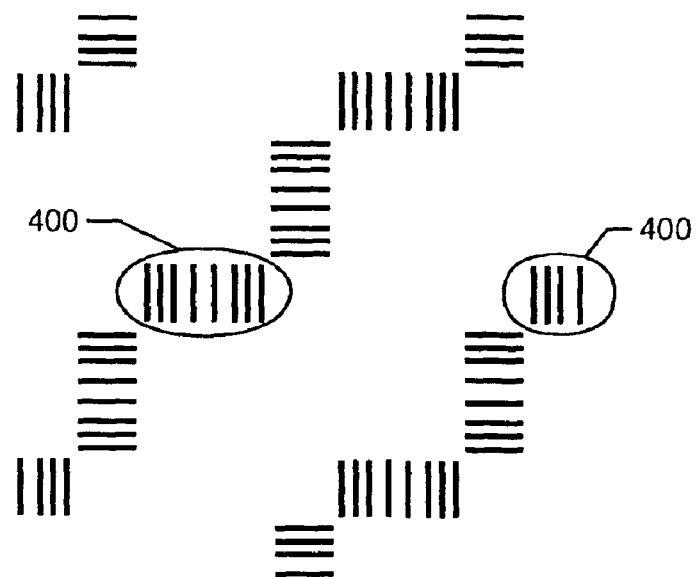
FIGS. 19–25 show different steps in a process for manufacturing a logic arrangement having microscale and nanoscale wires.
Figure 20:
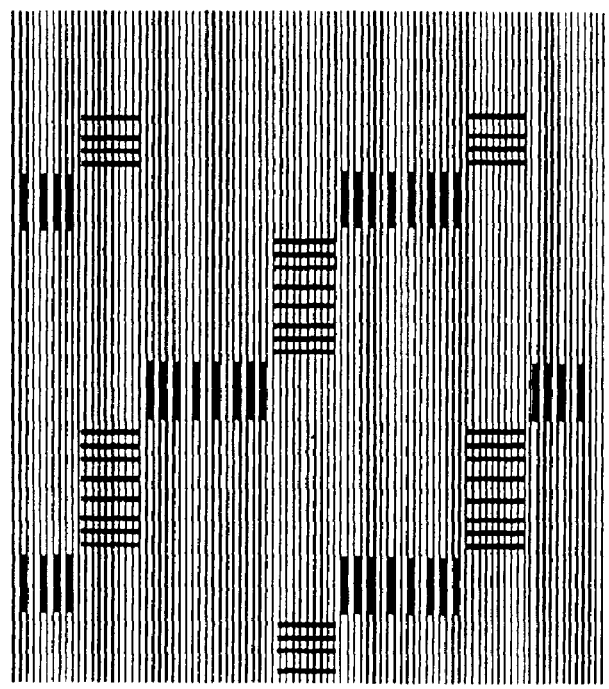
Figure 21:
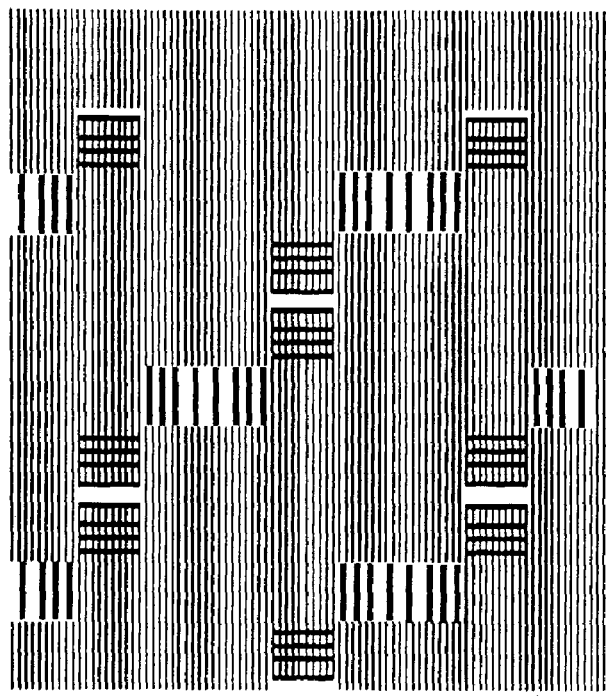
Figure 22:
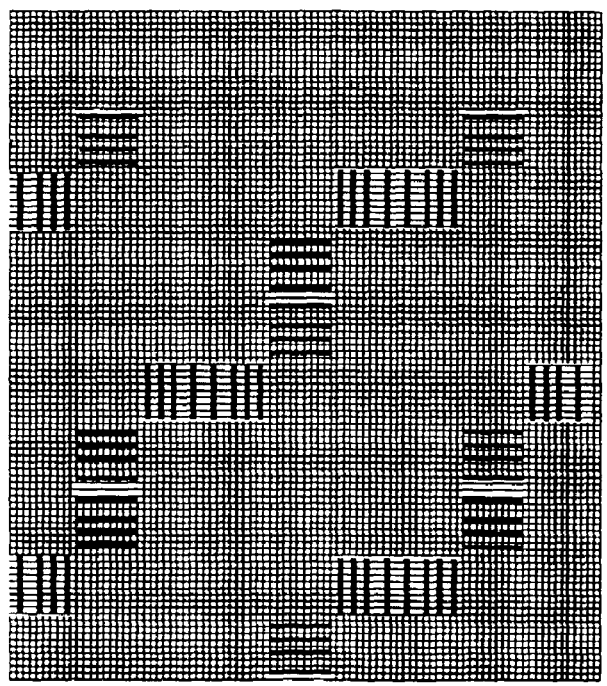

In the case of axially doped nanoscale wires, individual crosspoint junctions will be used for the memory core, as already explained above. A fabrication process for memories containing axially-doped nanoscale wires comprises the following steps:

1) Lithographically processing a silicon wafer to obtain a plurality of microscale wires.
2) Place oxide over the addressing portion of the microscale wires. FIG. 19 shows a possible disposition of the microwires after the first two steps of the fabrication process.
3) Mixing together a first set of axially-doped nanoscale wires. Mixing together of the nanoscale wires without causing contact between the nanoscale wires is obtained by growing an oxide layer, such as the oxide layer 10 in FIG. 2, around each nanoscale wire. The oxide layer prevents two nanoscale wires which are aligned parallel to each other from touching in their conduction regions (and hence shorting together) and acts as the oxide barrier allowing FET control rather than diode contact.
4) Aligning the first set of nanoscale wires and transferring the aligned first set above the microscale wires. FIG. 20 shows a possible chip state after the fourth step. Alignment of the nanoscale wires is obtained, for example, by means of a Langmuir-Blodgett flow (LB-flow) technique disclosed, for example, in Ulman A., "An introduction to ultrathin organic films: from Langmuir-Blodgett to self-assembly" Academic Press: New York, 1991, or Albrecht O., Matsuda H., Eguchi K., and Nakagiri T., "Construction and use of LB deposition machines for pilot production", Thin Solid Films, vol. 284/285 15 Sep. 1996, pp152–156. LB-flow allows transfer of tight-packed, aligned nanoscale wires onto a surface.
5) Obtain breaks in the structure, perpendicular to the axis of alignment, by lithographic etching. FIG. 21 shows the fabrication state after the fifth step.
6) Mixing together a second set of axially-doped nanoscale wires.
7) Aligning the second set of nanoscale wires and transferring the aligned second set on the circuit, orthogonally to the first set of nanoscale wires, as shown in FIG. 22. Additionally, a molecular layer (not shown in the Figure) is placed between the orthogonal sets of nanowires. Such layer is disclosed, for example, in Christopher L. Brown and Ulrich Jonas and Jon A. Preece and Helmut Ringsdorf and Markus Seitz and J. Fraser Stoddart, "Introduction of [2]Catenanes into Langmuir Films and Langmuir-Blodgett Multilayers. A Possible Strategy for Molecular Information Storage Materials", Langmuir 16(4), 1924–1930, 2000.
8) Obtain breaks in the structure, perpendicular to the axis of alignment, by lithographic etching. See FIG. 23.
9) Filling metal over regions of ohmic contact, as shown in FIG. 24, thus obtaining the structure of FIG. 25.

Fabrication Process in the Case of Axially and Radially Doped Nanoscale Wires

In the case of nanoscale wires which are both axially and radially doped, the fabrication process is similar to process already described above, and reference can be made to already described FIGS. 19–25. However, there will be no need to place a molecular layer between the orthogonal sets of nanowires.

Following a first step such as the one shown in FIG. 19, where a disposition of microscale address wires 400 obtained by lithographically processing a silicon wafer is represented, two sets of nanoscale wires are grown. Differently from the previous embodiment, here the first set is axially modulation-doped and then radially modulation-doped on top of the axial coding, while the second set is axially coded only.

After mixing together the axially doped-only nanoscale wires, the mixed nanoscale wires are LB-flow aligned and then transferred to cover the silicon surface, as shown in FIG. 20. Further, desired breaks between subarrays perpendicular to the axis of alignment are lithographically etched, as shown in FIG. 21.

Figure 23:
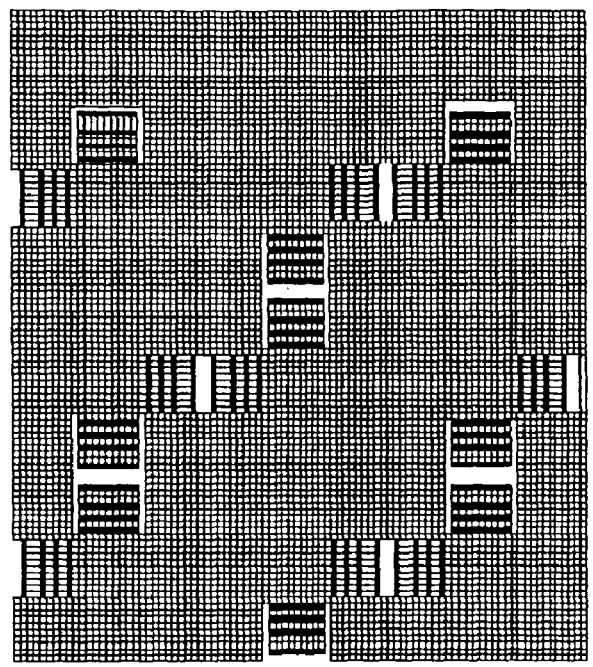
Figure 24:
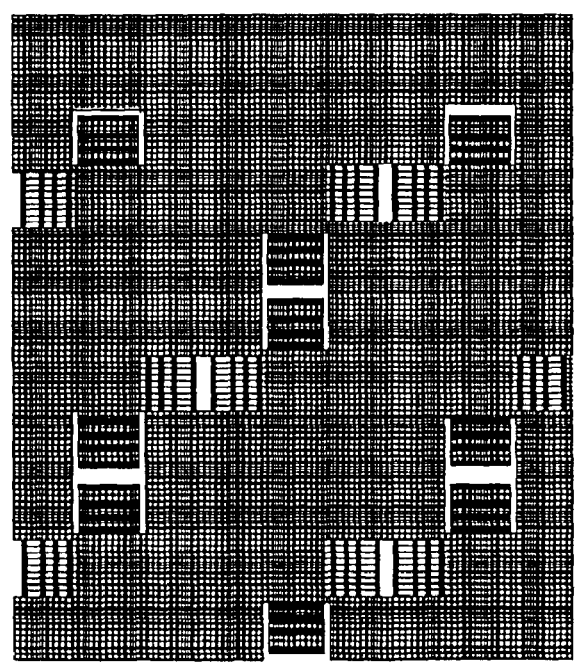

After mixing the set of axially and radially doped nanoscale wires, the mixed set is LB-flow aligned and transferred to cover the silicon surface, orthogonal to the other set, as shown in FIG. 22, and then desired breaks between subarrays are lithographically etched perpendicular to the axis of alignment, as shown in FIG. 23.

Differently from the previous embodiment, the present embodiment comprises a step where radial doping of tubes over the address window is etched away, as shown in FIG. 24. In particular, FIG. 24 shows a mask comprising address windows, i.e. windows corresponding to the address regions of the logic circuit to be built, such as the address regions 80 and 82 of FIG. 11. Only address windows containing radially doped nanoscale wires will be taken into consideration, and the radial doping of the nanoscale wires will be etched away in those regions, thus allowing addressing of the nanoscale wires as shown, for example, in FIG. 5 of the present application.

Figure 25:
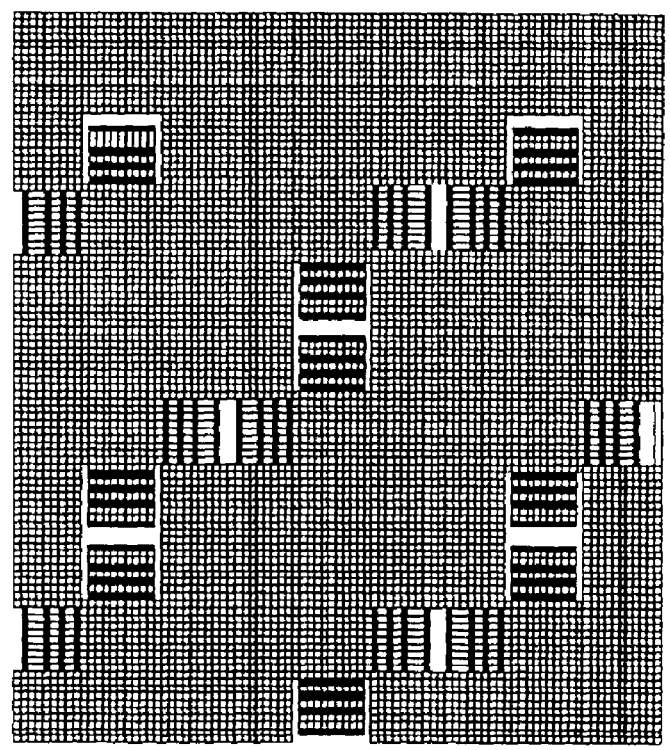

In a further step, metal is filled over regions of ohmic contact, as shown in FIG. 25.

Figure 1:
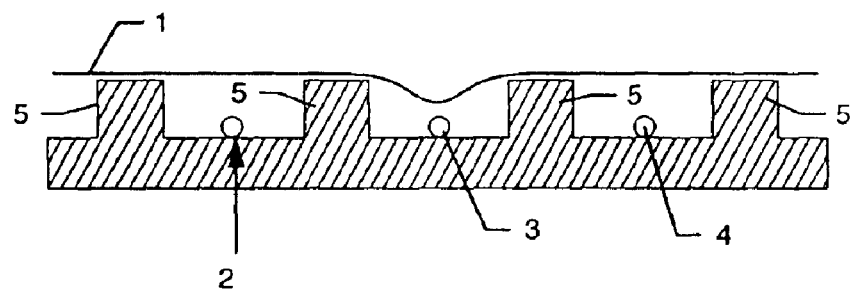
FIG. 1 shows a schematic cross-sectional view of a prior art nanotube-based programmable switchpoint.

In the present embodiment, there is no need for a separate device with hysteresis (e.g. some molecule) at the crosspoint, such as the suspended nanotube shown in FIG. 1, because the radial doping will allow information to be stored along the diameter of a predetermined section of the vertical nanoscale wires. Specifically, the radially modulation doped wire structure effectively includes a device with hysteresis.

A further embodiment can be provided, where both sets of wires are radially modulation doped.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. A memory array comprising:
   a first set of nanoscale wires;
   a second set of nanoscale wires intersecting the first set of nanoscale wires, intersections between the first set and the second set defining memory locations;
   wherein the memory locations are addressed by selecting one nanoscale wire of the first set of nanoscale wires and one wire of the second set of nanoscale wires;
   wherein nanoscale wires of the first set and nanoscale wires of the second set comprise controllable regions axially distributed along the nanoscale wires, a first set of the controllable regions exhibiting a first physical property, and a second set of the controllable regions exhibiting a second physical property, different from the first physical property;
   the memory array further comprising:
   a first plurality of addressing wires, each addressing wire of the first plurality associated with a series of regions of the first set of nanoscale wires; and
   a second plurality of addressing wires, each addressing wire of the second plurality associated with a series of regions of the second set of nanoscale wires.

2. The memory array of claim 1, wherein the first set of controllable regions allow conduction along the nanoscale wire when each region of the first set is either controlled with a signal having a value lower that a first threshold or is not controlled.

3. The memory array of claim 1, wherein the first set of controllable regions allow conduction along the nanoscale wire when each region of the first set is controlled with a signal having a value higher than a first threshold.

4. The memory array of claim 1, wherein the difference between the first physical property and the second physical property is based on different doping levels of the controllable regions.

5. The memory array of claim 1, wherein the difference between the first physical property and the second physical property is based on different materials of the controllable regions.

6. The memory array of claim 1, wherein the addressing wires allow a memory location to be into one of a plurality of states.

7. The memory array of claim 1, wherein the addressing wires allow a state of a memory location to be read.

8. The memory array of claim 1, wherein the memory locations are addressed in a reading operation.

9. The memory array of claim 1, wherein the memory locations are addressed in a writing operation.

10. The memory array of claim 1, further comprising microscale wires acting as ohmic contacts.

11. The memory array of claim 1, further comprising microscale wires allowing signals to be disconnected from the nanoscale wires.

12. The memory array of claim 1, wherein the microscale wires control FET-controllable regions.

13. The memory array of claim 1, wherein the memory locations are defined by means of programmable diode-type crossbar junctions between the first set and the second set.

14. The memory array of claim 1, wherein the memory locations are defined by means of FET-type crossbar junctions between the first set and the second set.

15. The memory array of claim 1, wherein nanoscale wires of one set among the first set and a second set of nanoscale wires comprise controllable doped regions radially distributed along the nanoscale wires, the radially distributed controllable doped regions allowing information to be stored at the memory locations.

16. The memory array of claim 1, wherein the regions of the first and second set are made of different materials.

17. The memory array of claim 1, wherein the addressing wires are microscale wires.

18. The memory array of claim 1, wherein the first set of nanoscale wires is part of a larger set of nanoscale wires, the first set being selected from the larger set by means of a microscale wire acting as an ohmic contact.

19. The memory array of claim 1, wherein the first and second set of nanoscale wires are part of larger sets of nanoscale wires, the first and second set being selected from the larger sets by means of microscale wires acting as ohmic contacts.

20. A memory array comprising:
   a first set of nanoscale wires;
   a second set of nanoscale wires intersecting the first set of nanoscale wires, intersections between the first set and the second set defining memory locations;
   wherein the memory locations are addressed by selecting one nanoscale wire of the first set of nanoscale wires and one wire of the second set of nanoscale wires;
   wherein nanoscale wires of the first set and nanoscale wires of the second set comprise controllable regions axially distributed along the nanoscale wires, a first set of the controllable regions exhibiting a first physical property, and a second set of the controllable regions exhibiting a second physical property, different from the first physical property;

the memory array further comprising:
a first plurality of addressing wires, each addressing wire of the first plurality associated with a series of regions of the first set of nanoscale wires; and
a second plurality of addressing wires, each addressing wire of the second plurality associated with a series of regions of the second set of nanoscale wires wherein the addressing wires are nanoscale wires.

21. A memory array comprising:
a plurality of nanoscale wires;
a first set of microscale wires intersecting the nanoscale wires, intersections between the first set of microscale wires and the nanoscale wires defining address locations to address one or more nanoscale wires among the plurality of nanoscale wires; and
a second set of microscale wires intersecting the nanoscale wires, intersections between the second set of microscale wires and the nanoscale wires defining memory locations.

22. The memory array of claim 21, wherein the memory locations are selected by selecting one nanoscale wire and one microscale wire of the second set of microscale wires.

23. The memory array of claim 21, wherein the nanoscale wires comprise controllable regions axially distributed along the nanoscale wires, a first set of the controllable regions exhibiting a first physical property, and a second set of the controllable regions exhibiting a second physical property, different from the first physical property.

24. The memory array of claim 23, wherein the difference between the first physical property and the second physical property is based on different doping levels of the controllable regions.

25. The memory array of claim 23, wherein the difference between the first physical property and the second physical property is based on different materials of the controllable regions.

26. The memory array of claim 23, wherein the first set of controllable regions allow conduction along the nanoscale wire when each region of the first set is either controlled with a signal having a value lower than a first threshold or is not controlled.

27. The memory array of claim 23, wherein the first set of controllable regions allow conduction along the nanoscale wire when each region of the first set is controlled with a signal having a value higher than a first threshold.

28. The memory array of claim 21, wherein the memory locations are addressed in a reading operation.

29. The memory array of claim 21, wherein the memory locations are addressed in a writing operation.

30. The memory array of claim 21, further comprising microscale ohmic contacts, each ohmic contact connected to a different subset of the plurality of nanoscale wires for selecting a specific subset of the plurality of nanoscale wires.

31. A memory array comprising:
a plurality of nanoscale wires;
a first set of microscale wires intersecting the nanoscale wires, intersections between the first set of microscale wires and the nanoscale wires defining address locations to address one or more nanoscale wire among the plurality of nanoscale wires; and
a second set of microscale wires intersecting the nanoscale wires, intersections between the second set of microscale wires and the nanoscale wires defining memory locations; and
microscale ohmic contacts, each ohmic contact connected to a different subset of the plurality of nanoscale wires for selecting a specific subset of the plurality of nanoscale wires wherein the microscale ohmic contacts are staggered there-between.

32. A three-dimensional memory array comprising:
a plurality of layers of nanoscale wires, intersections between nanoscale wires of a first layer and nanoscale wires of a second layer adjacent to the first layer defining memory locations;
a plurality of microscale contacts connected to nanoscale wires of different layers of nanoscale wires;
wherein the nanoscale wires comprise controllable regions axially distributed along the nanoscale wires, to allow addressing of the nanoscale wires, a first set of the controllable regions exhibiting a first physical property, and a second set of the controllable regions exhibiting a second physical property, different from the first physical property.

33. The three-dimensional memory array of claim 32, wherein the layers of nanoscale wires are so arranged to define repeated occurrences of adjacent sets of layers comprising:
a first layer of memory-location-defining nanoscale wires;
a second layer of memory-location-defining nanoscale wires; and
a layer of insulating nanoscale wires.

34. The three-dimensional memory array of claim 32, wherein nanoscale wires located on different layers and sharing a microscale contact are each independently addressable.

35. The three-dimensional memory array of claim 32, wherein groups of the nanoscale wires can be independently addressed, the number of groups being a large fraction of the number of nanowires in the array.

36. A circuit for selecting a nanoscale wire among a plurality of nanoscale wires, comprising:
microscale ohmic contacts, each ohmic contact connected to a different subset of the plurality of nanoscale wires for selecting a specific subset of the plurality of nanoscale wires; and
addressing wires associated with the different subsets of the plurality of nanoscale wires, for selecting a nanoscale wire among the specific subset of nanoscale wires once the specific subset has been selected, wherein the addressing wires associated with a first different subset are the same as the addressing wires associated with a second different subset.

37. The circuit of claim 36, wherein the addressing wires are microscale wires.

38. The circuit of claim 36, wherein the addressing wires are nanoscale wires.

39. The circuit of claim 36, wherein the microscale ohmic contacts are designed to abut tightly to leave not more than a sublithographic sized gap of unaddressable nanowires between them.

40. The circuit of claim 36 or 39, wherein the microscale ohmic contacts are staggered there-between.

41. A circuit for selecting a nanoscale wire among a plurality of nanoscale wires, comprising:
microscale ohmic contacts, each ohmic contact connected to a different subset of the plurality of nanoscale wires for selecting a specific subset of the plurality of nanoscale wires; and
addressing wires associated with the different subsets of the plurality of nanoscale wires, for selecting a nanoscale wire among the specific subset of nanoscale wires once the specific subset has been selected, wherein the addressing wires are nanoscale wires.

42. A circuit for selecting a nanoscale wire among a plurality of nanoscale wires, comprising:
microscale ohmic contacts, each ohmic contact connected to a different subset of the plurality of nanoscale wires for selecting a specific subset of the plurality of nanoscale wires; and
addressing wires associated with the different subsets of the plurality of nanoscale wires, for selecting a nanoscale wire among the specific subset of nanoscale wires once the specific subset has been selected, wherein the microscale ohmic contacts are designed to abut tightly to leave not more than a sublithographic sized gap of unaddressable nanowires between them.

43. The circuit of claim 42, wherein the microscale ohmic contacts are staggered there-between.

44. A circuit for selecting a nanoscale wire among a plurality of nanoscale wires, comprising:
microscale ohmic contacts, each ohmic contact connected to a different subset of the plurality of nanoscale wires for selecting a specific subset of the plurality of nanoscale wires; and
addressing wires associated with the different subsets of the plurality of nanoscale wires, for selecting a nanoscale wire among the specific subset of nanoscale wires once the specific subset has been selected, wherein the microscale ohmic contacts are staggered there-between.

45. A process for manufacturing a logic arrangement having microscale and nanoscale wires, comprising:
providing microscale wires;
determining an addressing portion on the microscale wires;
axially doping a first set of nanoscale wires;
aligning the first set of nanoscale wires;
transferring the first set of aligned nanoscale wires over the microscale wires;
axially doping a second set of nanoscale wires;
aligning the second set of nanoscale wires;
transferring the second set of aligned nanoscale wires over the microscale wires and the first set of nanoscale wires, orthogonally to the first set of nanoscale wires.

46. The process of claim 45, wherein alignment of the first set and second set of the nanoscale wires is obtained by means of a LB-flow technique.

47. The process of claim 45, further comprising radially doping the nanoscale wires.

48. The process of claim 47, further comprising etching away a radially doped portion from the nanoscale wires.

49. The process of claim 45, further comprising etching breaks in the nanowires.

* * * * *